United States Patent
Cho et al.

(10) Patent No.: US 11,658,195 B2
(45) Date of Patent: May 23, 2023

(54) IMAGE SENSOR INCLUDING MICROLENSES HAVING DIFFERENT SHAPES

(71) Applicant: SK hynix Inc., Icheon-si (KR)

(72) Inventors: Sung Wook Cho, Icheon-si (KR); Han Jun Kim, Icheon-si (KR); Min Su Cho, Icheon-si (KR)

(73) Assignee: SK hynix Inc., Icheon-si (KR)

(*) Notice: Subject to any disclaimer, the term of this patent is extended or adjusted under 35 U.S.C. 154(b) by 166 days.

(21) Appl. No.: 17/019,100

(22) Filed: Sep. 11, 2020

(65) Prior Publication Data
US 2021/0143200 A1     May 13, 2021

(30) Foreign Application Priority Data

Nov. 11, 2019  (KR) .................. 10-2019-0143580

(51) Int. Cl.
*H01L 27/146*     (2006.01)

(52) U.S. Cl.
CPC .. *H01L 27/14627* (2013.01); *H01L 27/14603* (2013.01); *H01L 27/14605* (2013.01); *H01L 27/14607* (2013.01); *H01L 27/14621* (2013.01); *H01L 27/14623* (2013.01); *H01L 27/14643* (2013.01); *H01L 27/14645* (2013.01); *H01L 27/14683* (2013.01)

(58) Field of Classification Search
CPC ......... H01L 27/14627; H01L 27/14605; H01L 27/14621; H01L 27/14623; H01L 27/14645; H01L 27/14607; H01L 27/14643; H01L 27/14603; H01L 27/14665; H04N 5/23229; G02F 1/133526
See application file for complete search history.

(56) References Cited

U.S. PATENT DOCUMENTS

| | | |
|---|---|---|
| 6,638,786 B2 | 10/2003 | Yamamoto |
| 10,644,050 B2 | 5/2020 | Cho et al. |
| 2008/0302952 A1* | 12/2008 | Yamashita ........ H01L 27/14621 250/226 |
| 2012/0001286 A1* | 1/2012 | Yoon .................. H01L 27/14685 257/E31.127 |
| 2019/0081098 A1* | 3/2019 | Lenchenkov .......... H04N 5/378 |
| 2019/0123083 A1* | 4/2019 | Borthakur ......... H01L 27/14621 |
| 2019/0215474 A1* | 7/2019 | Nojima ............. H01L 27/14607 |
| 2021/0368117 A1* | 11/2021 | Nishi ................ H01L 27/14623 |

FOREIGN PATENT DOCUMENTS

KR     10-2018-0054733 A     5/2018

* cited by examiner

*Primary Examiner* — Jennifer D Bennett
*Assistant Examiner* — Erin R Garber
(74) *Attorney, Agent, or Firm* — Perkins Coie LLP

(57) ABSTRACT

An image sensor is disclosed. The image sensor includes a pixel region and a shield region. The pixel region includes a first microlens array that includes microlenses arranged in a first direction and a second direction perpendicular to the first direction. The shield region surrounds the pixel region and includes a second microlens array formed in a shape that is obtained when the first microlens array is rotated by a predetermined angle with respect to the first direction.

19 Claims, 25 Drawing Sheets

IMAGE SENSOR INCLUDING MICROLENSES HAVING DIFFERENT SHAPES

CROSS-REFERENCE TO RELATED APPLICATION

This patent document claims the priority and benefits of Korean patent application No. 10-2019-0143580, filed on Nov. 11, 2019, the disclosure of which is incorporated herein by reference in its entirety as part of the disclosure of this patent document.

TECHNICAL FIELD

The technology and implementations disclosed in this patent document generally relate to an image sensor including a microlens array.

BACKGROUND

An image sensor is a semiconductor device for capturing and converting light of optical images into electrical signals for displaying the captured images and for further processing of the captured images. The development of various industries and sectors, including automotive, medical, computer, and communication industries generates various demands and growth for high-quality and high-performance image sensors in various devices and systems such as smartphones, digital cameras, game consoles, Internet of Things (IoT), robots, surveillance cameras, medical microcameras, etc.

One common type of image sensing devices is a charge coupled device (CCD), which has dominated the field of image sensors for a long time. Another common type of image sensing device is a complementary metal oxide semiconductor (CMOS) image sensing device. CCD image sensors have advantages over the CMOS image sensor in terms of noise characteristics and image quality. However, CMOS image sensors are now widely used due to certain advantages over the CCD counterparts, including, e.g., higher frame rates and shutter speed. In addition, CMOS image sensors and signal processing circuitry can be integrated into a single chip, making it possible to miniaturize electronic devices while achieving lower power consumption. In addition, using the CMOS fabrication technology can result in reduction in the production costs. Such characteristics of CMOS image sensors make these sensors better suited for implementations in mobile devices.

SUMMARY

The embodiments of the disclosed technology, among other features and benefits, relate to an image sensor that can reduce or minimize the noise in an image by preventing scattered light (or diffused light) from impacting imaging pixels.

In an embodiment of the disclosed technology, an image sensor may include a pixel region including a first microlens array that includes microlenses arranged in a first direction and a second direction perpendicular to the first direction, and a shield region configured to surround the pixel region, and configured to include a second microlens array formed in a shape that is obtained when the first microlens array is rotated by a predetermined angle with respect to the first direction.

In another embodiment of the disclosed technology, an image sensor a first microlens array including microlenses that are arranged in a first direction and a second direction perpendicular to the first direction corresponding to respective pixels, and a second microlens array surrounding the first microlens array and including microlenses arranged with the same pitch as the microlenses arranged in the first microlens array in a third direction and a fourth direction perpendicular to the third direction, the third direction is rotated by a predetermined angle relative to the first direction.

In another embodiment of the disclosed technology, an image sensor may include a pixel region configured to include a first microlens array in which microlenses are arranged in a first direction and a second direction perpendicular to the first direction, and a shield region configured to surround the pixel region, and configured to include a second microlens array formed in a shape that is obtained when the first microlens array is rotated by a predetermined angle with respect to the first direction.

In another embodiment of the disclosed technology, an image sensor may include a first microlens array configured to include microlenses that are arranged in a first direction and a second direction perpendicular to the first direction in response to respective pixels, and a second microlens array configured to surround the first microlens array, and configured to include a second microlens array formed in a shape that is obtained when the first microlens array is rotated by a predetermined angle with respect to the first direction.

DETAILED DESCRIPTION

Figure 1:
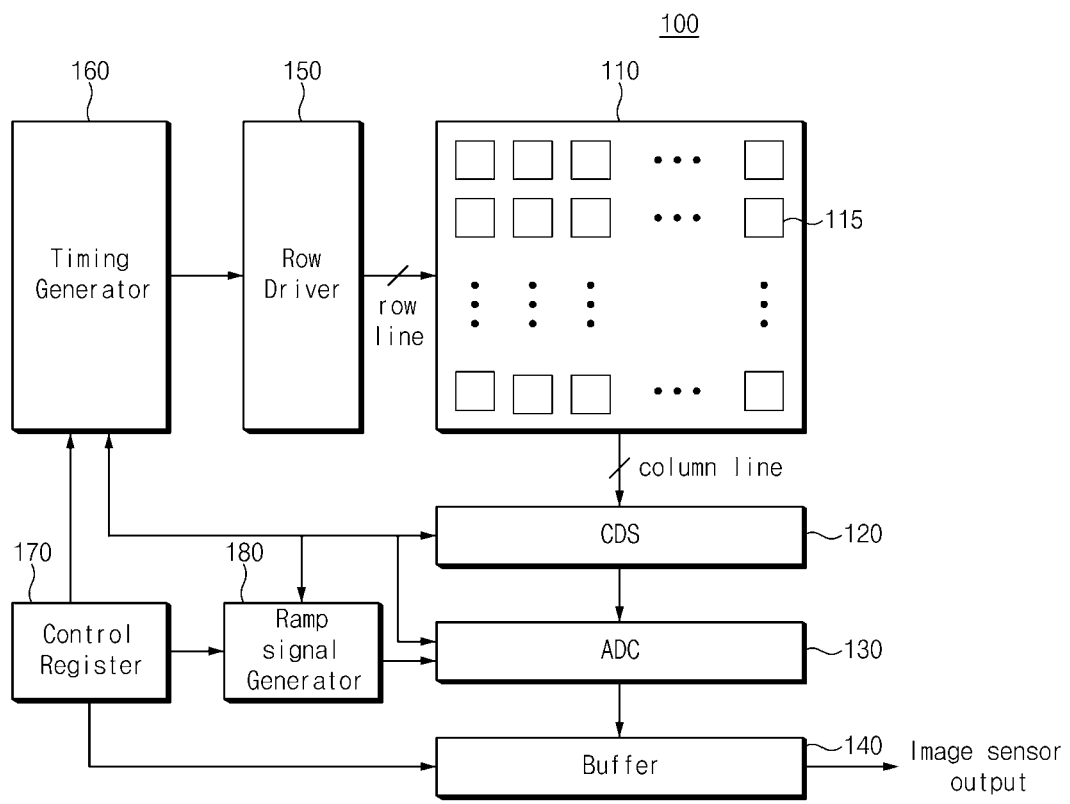
FIG. 1 is a block diagram illustrating an example of an image sensor based on some implementations of the disclosed technology.

This patent document provides implementations and examples of an image sensor that can reduce noise that occurs due to scattered light (or diffused light). In some embodiments of the disclosed technology, image sensors may include a peripheral microlens array that is rotated relative to an effective microlens array to reduce noise by minimizing flare phenomenon generable by backscattered light (BL) from the microlens.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein, but on the contrary, the disclosure is intended to cover various modifications, equivalents, and alternatives falling within the spirit and scope of the embodiments. In the drawings, the sizes and shapes of elements may be exaggerated for convenience and clarity of description.

FIG. 1 is a block diagram illustrating an example of an image sensor 100 based on some implementations of the disclosed technology.

In some implementations, the image sensor 100 may include a pixel array 110, a correlated double sampler (CDS) circuit 120, an analog-to-digital converter (ADC) circuit 130, a buffer 140, a row driver 150, a timing generator 160, a control register 170, and a ramp signal generator 180.

The pixel array 110 may include a plurality of pixel blocks 115 arranged in a matrix shape. Each of the pixel blocks 115 may convert optical image information into an electrical image signal, and may output the electrical image signal to the correlated double sampler (CDS) circuit 120 through column lines. Each of the pixel blocks 115 may be coupled to any one of row lines and any one of column lines.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured.

The correlated double sampler (CDS) circuit 120 may sample the electrical image signal received from the pixel blocks 115 of the pixel array 110. For example, the correlated double sampler (CDS) circuit 120 may perform sampling of a reference voltage level and a voltage level of the received electrical image signal in response to a clock signal received from the timing generator 160, and may transmit an analog signal corresponding to a difference between the reference voltage level and the voltage level of the received electrical image signal to the analog-to-digital converter (ADC) circuit 130.

The analog-to-digital converter (ADC) circuit 130 is used to convert analog CDS signals to digital signals. Examples of the analog-to-digital converter (ADC) circuit 130 may include a ramp-compare type analog-to-digital converter that compares the analog pixel signal with a reference signal such as a ramp signal that ramps up or down, and a timer counts until a voltage of the ramp signal matches the analog pixel signal.

The analog-to-digital converter (ADC) circuit 130 may convert the received analog signal into a digital signal, and may transmit the digital signal to the buffer 140.

The buffer 140 may temporarily hold or "latch" the received digital signals to sequentially output the latched digital signals to an external image signal processor. The buffer 140 may include a memory for latching the digital signal and a sense amplifier for amplifying the digital signal.

The row driver 150 may be used to activate or drive interconnect lines in the pixel blocks 115 of the pixel array 110 in response to an output signal of the timing generator 160. For example, the row driver 150 may generate selection signals to select any one of the row lines, and/or may generate drive signals to drive any one of the row lines.

The timing generator 160 may generate a timing signal to control the correlated double sampler (CDS) circuit 120, the analog-to-digital converter (ADC) circuit 130, the row driver 150, and the ramp signal generator 180.

The control register 170 may generate control signals to control the buffer 140, the timing generator 160, and the ramp signal generator 180.

The ramp signal generator 180 may generate a ramp signal for allowing the ADC circuit 130 to perform analog-to-digital conversion (ADC) in response to a control signal received from the timing generator 160.

Figure 2:
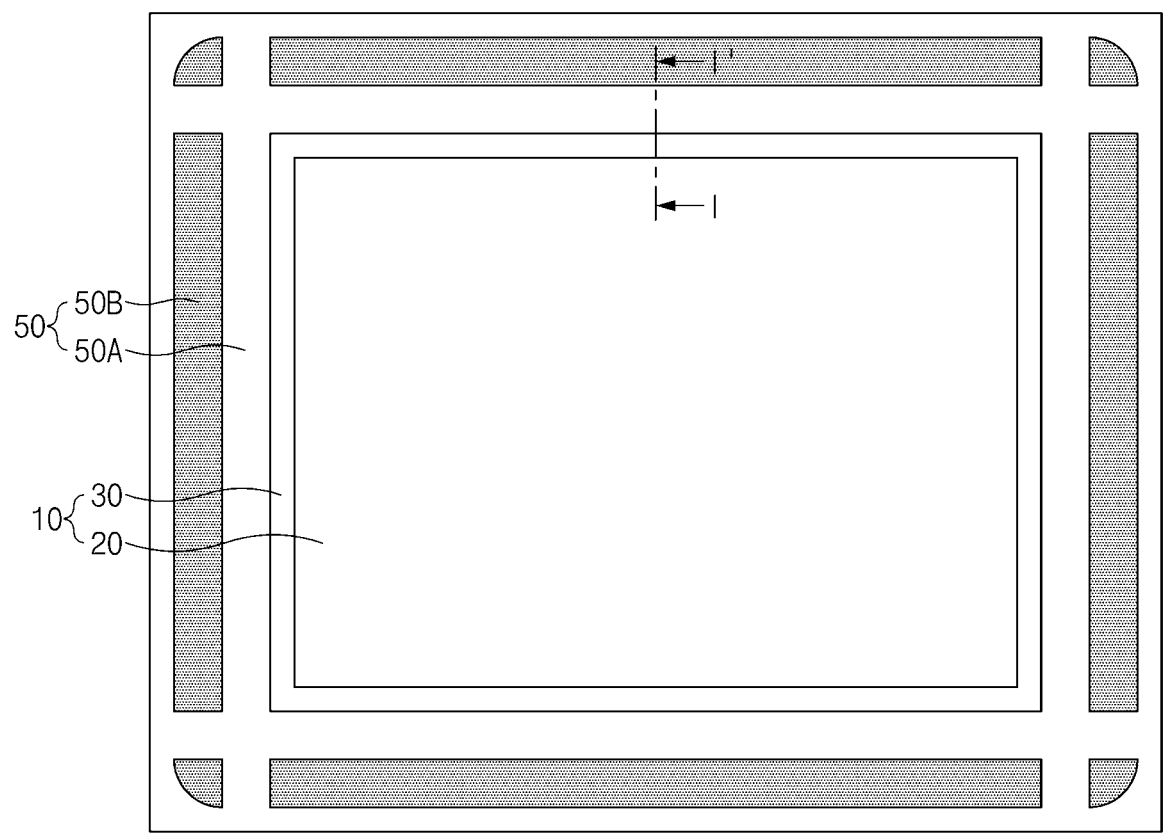
FIG. 2 is a schematic layout diagram illustrating an example of the image sensor shown in FIG. 1 based on some implementations of the disclosed technology.

FIG. 2 is a schematic layout diagram illustrating an example of the image sensor 100 shown in FIG. 1 based on some implementations of the disclosed technology.

Referring to FIG. 2, the image sensor 100 may include a pixel region 10 and a shield region 50.

The pixel region 10 may include an effective pixel region 20 and an extra "dummy" pixel region 30. Here, the effective pixel region 20 may include effective pixels that are the pixels that capture the image to convert it to image data. The extra "dummy" pixel region 30 may include "dummy pixels" that are the peripheral pixels for other sensing operations and whose output signals are not directly used for forming a part of the output image. In some implementations, the output signals from the peripheral pixels may be used to compensate for errors caused by electrical interference or optical interference between different imaging pixels. The effective pixel region 20 may be formed in a rectangular shape, and may be located at the center of the image sensor 100. The dummy pixel region 30 may be formed in a rectangular frame shape surrounding the effective pixel region 20.

The shield region 50 may include at least one pixel shield region 50A and at least one logic shield region 50B. The pixel shield region 50A may be arranged in a rectangular frame shape surrounding a peripheral region of the pixel region 10. The logic shield regions 50B may be spaced apart from the pixel region 10 by a predetermined distance and arranged to surround the pixel region 10 and the pixel shield region 50A. For example, the logic shield regions 50B may be disposed in or over the pixel shield region 50A. The logic shield regions 50B may be arranged in a bar or island shape that is adjacent to sides and/or corners of the pixel shield region 50A. Horizontal or vertical lengths of each logic shield region 50B may be identical to or less than horizontal or vertical widths of the dummy pixel region 30.

In some implementations, the logic shield regions 50B may be optionally arranged. For example, the logic shield regions 50B may be arranged in at least one of four sides of the pixel shield region 50A, and/or may be arranged in at least two of four corners of the pixel shield region 50A.

Figure 3A:
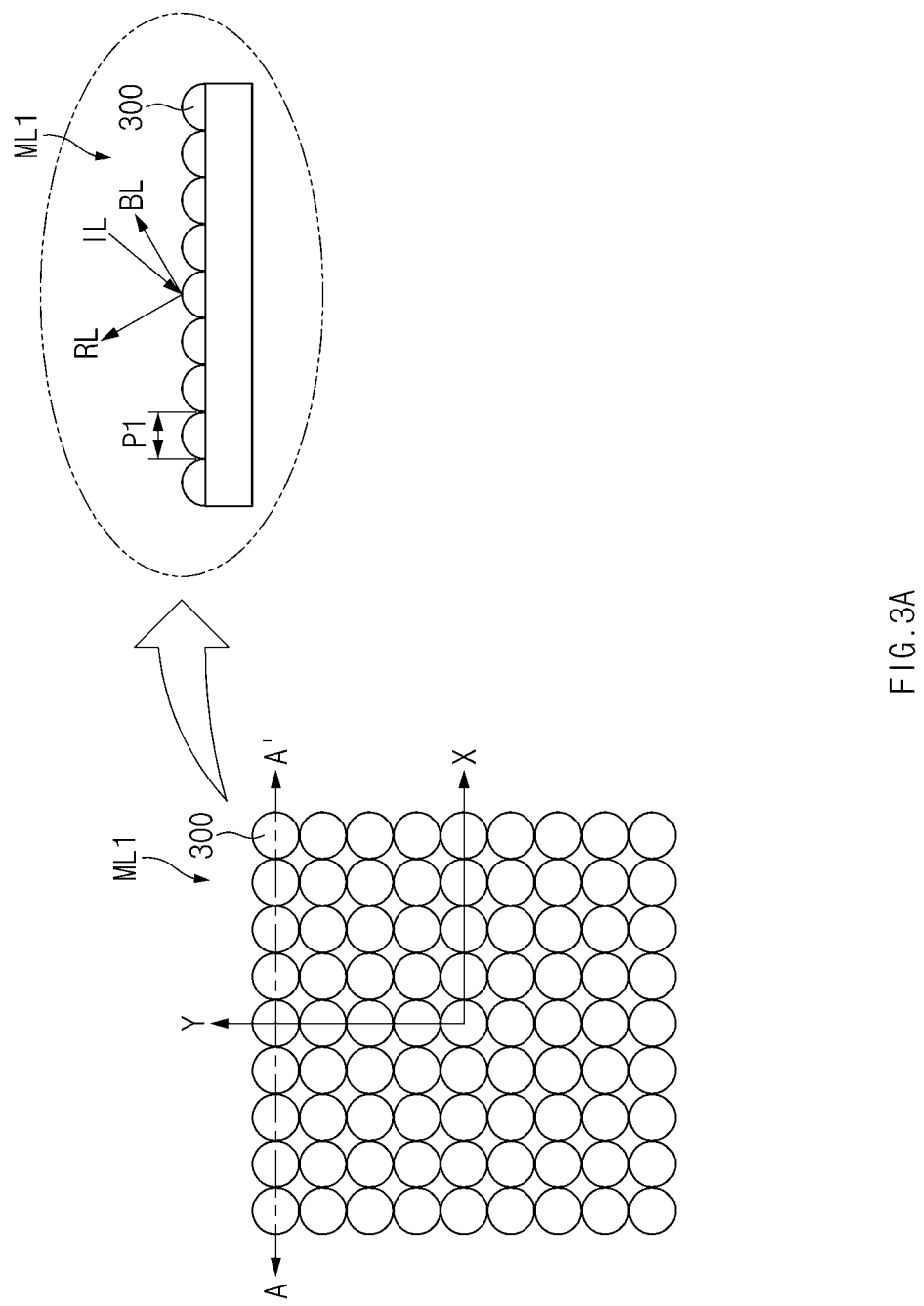
FIG. 3A is a schematic diagram illustrating an example of a first microlens array arranged in the image sensor shown in FIG. 2 based on some implementations of the disclosed technology.

FIG. 3A is a schematic diagram illustrating an example of a first microlens array (ML1) arranged in the image sensor 100 shown in FIG. 2 based on some implementations of the disclosed technology.

Referring to FIG. 3A, the first microlens array (ML1) may refer to a microlens array arranged in the image sensor 100, and the first microlens array (ML1) may be arranged in an effective pixel region 20. In some embodiments of the disclosed technology, the first microlens array (ML1) may be arranged in at least a portion of the dummy pixel region 30.

The first microlens array (ML1) may include a plurality of microlenses 300 arranged in rows and columns in an X-axis or Y-axis direction. The microlenses 300 may be formed in compliance with the same specifications (e.g., shape, width, thickness, curvature, diameter, volume). In some implementations, the X-axis direction may refer to a row direction of the pixel array 110, and the Y-axis direction may refer to a column direction of the pixel array 110. The cross-sectional view of the first microlens array (ML1) taken along the line A-A' parallel to the X-axis direction is illustrated in the right side of FIG. 3A. That is, the microlenses 300 arranged in the first microlens array (ML1) may be arranged repeatedly and side-by-side. In some implementations, the first microlens array (ML1) may include a set of first iterative (or periodic) units such that each first iterative unit includes one microlens. Each first iterative unit has a first width (P1). For example, a horizontal width (e.g., a diameter) of each of the microlenses 300 may be substantially identical to the first width (P1) of each first iterative unit. Here, the first width may also be called "pitch".

In addition, each microlens 300 may be used to focus and concentrate light onto a corresponding photo sensing device (e.g., photodiode) disposed under each microlens 300 as will be discussed below with reference to FIG. 7.

Examples of light rays are illustrated in FIG. 3A. Incident light (IL) represents the light that is incident upon the first microlens array (ML1); reflected light (RL) represents the light that is reflected by the microlenses 300, and backscattered light (BL) represents the light that is reflected by the microlenses in directions with small angles from the direction of the incident light IL. In one example, the reflected light (RL) may refer to the light that is reflected toward a direction different from the source of the incident light (IL), and the backscattered light (BL) may refer to the light that is reflected in a direction opposite to or nearly opposite to the incident direction of the incident light (IL).

Figure 3B:
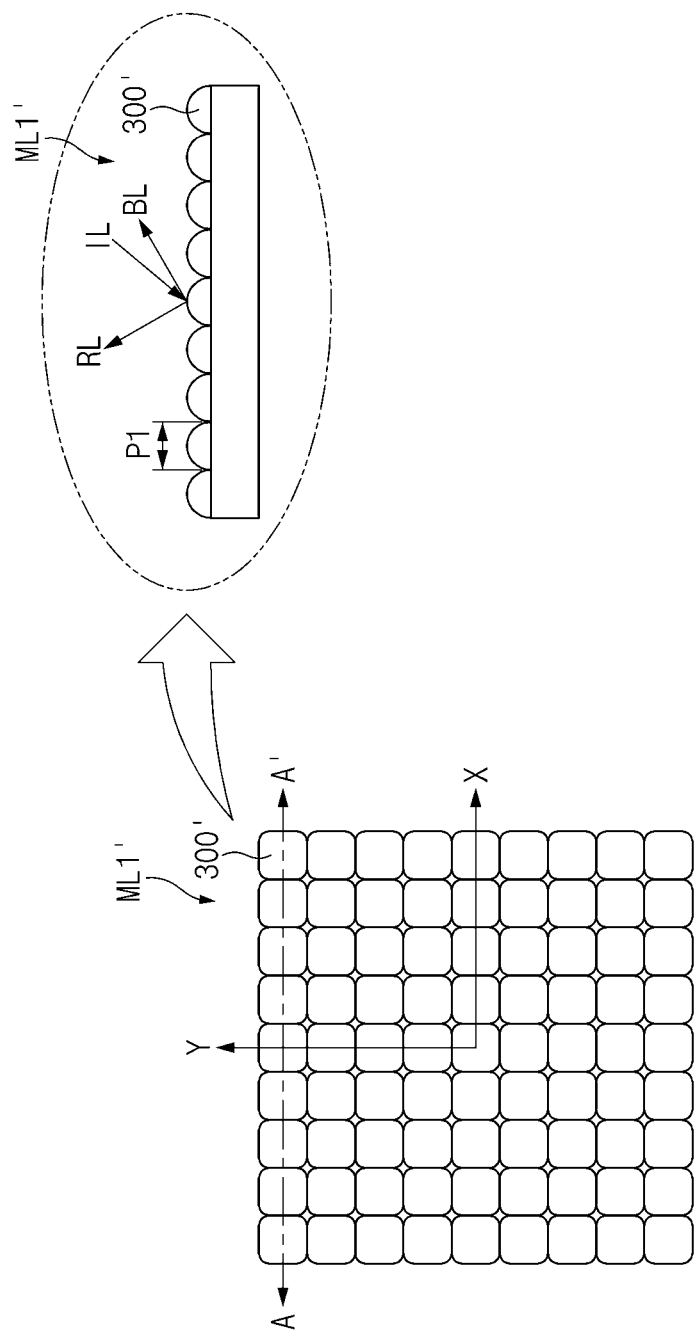
FIG. 3B is a schematic diagram illustrating another example of the first microlens array arranged in the image sensor shown in FIG. 2 based on some implementations of the disclosed technology.

FIG. 3B is a schematic diagram illustrating another example of the first microlens array arranged in the image sensor shown in FIG. 2 based on some implementations of the disclosed technology.

Referring to FIG. 3B, the first microlens array (ML1') may refer to a microlens array arranged in the image sensor 100, and may be arranged in the effective pixel region 20. In some embodiments of the disclosed technology, the first microlens array (ML1') may be arranged in at least a portion of the dummy pixel region 30.

The first microlens array (ML1') shown in FIG. 3B may include a plurality of microlenses 300' arranged in rows and columns in the X-axis or Y-axis direction. Each of the microlenses 300' may be formed in a rectangular shape in which each corner is curved (or rounded) unlike the circular shape of the microlens 300 shown in FIG. 3A.

The remaining components shown in FIG. 3B other than the shape of the microlens 300' in the first microlens array (ML1') are identical or similar in structure and material to the first microlens array (ML1) shown in FIG. 3A.

Figure 4A:
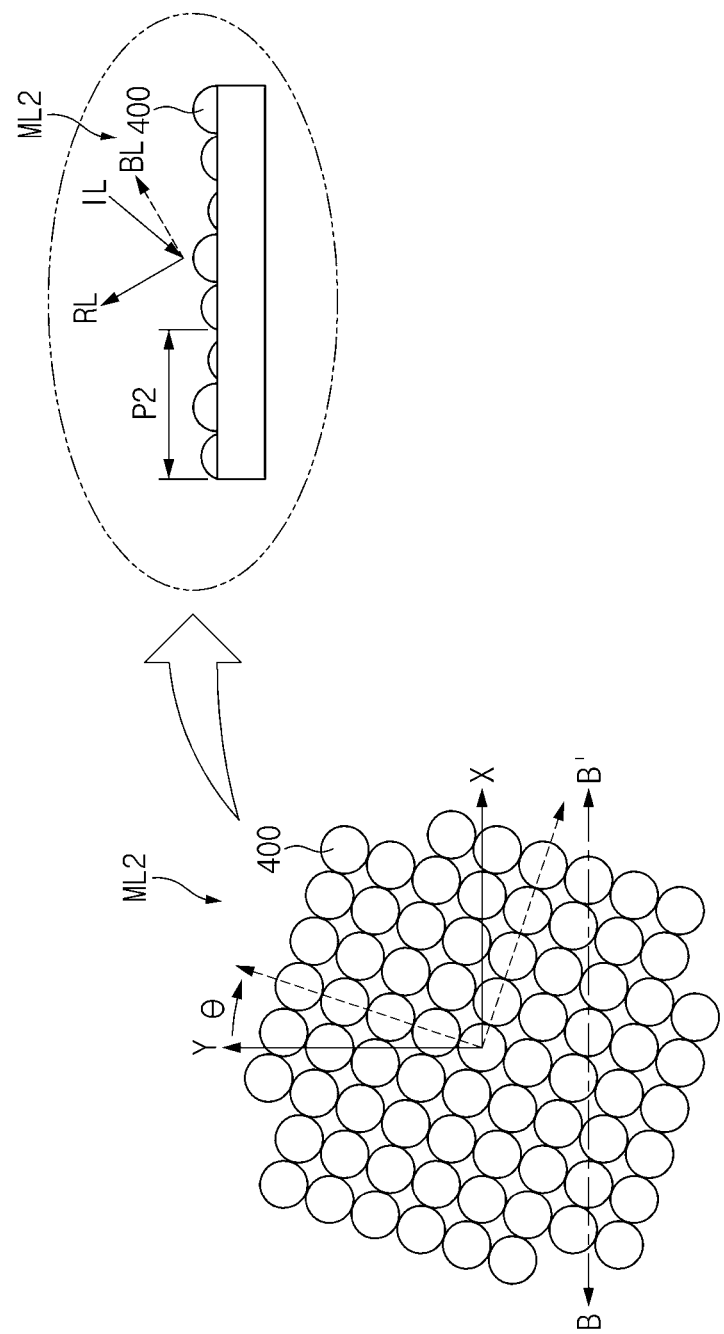
FIG. 4A is a schematic diagram illustrating an example of a second microlens array arranged in the image sensor shown in FIG. 2 based on some implementations of the disclosed technology.

FIG. 4A is a schematic diagram illustrating one example of the second microlens array (ML2) arranged in the image sensor 100 shown in FIG. 2 based on some implementations of the disclosed technology.

Referring to FIG. 4A, the second microlens array (ML2) may refer to a microlens array arranged in the image sensor 100, and may be arranged in at least one of a peripheral "dummy" pixel region 30, a pixel shield region 50A, and a logic shield region 50B. That is, the second microlens array (ML2) may be arranged along the edge of the effective pixel region 20.

The second microlens array (ML2) may include a plurality of microlenses 400 arranged in rows and columns like the first microlens array (ML1). However, the second microlens array (ML2) is rotated about the center of the array (or Z-axis) by a predetermined rotation angle (θ) compared to the first microlens array (ML1). For example, the second microlens array (ML2) may be implemented by rotating the first microlens array (ML1) by a predetermined rotation angle (θ).

In other words, the plurality of microlenses 300 may be arranged in a first direction (e.g., a column direction) or in a second direction (e.g., a row direction) perpendicular to the first direction in the first microlens array (ML1), and the second microlens array (ML2) may be implemented by rotating the first microlens array (ML1) by a predetermined angle (θ) with respect to the first direction.

The microlenses 400 may be formed in compliance with the same specifications (e.g., shape, width, thickness, curvature, diameter, volume). In some embodiments of the disclosed technology, the microlenses 400 shown in FIG. 4A may be formed in compliance with the same specifications as those of the microlenses 300 shown in FIG. 3A.

The cross-sectional view of the second microlens array (ML2) taken along the line B-B' parallel to the X-axis is illustrated in the right side of FIG. 4A. The cutting line B-B' of FIG. 4A and the cutting line A-A' of FIG. 3A may be arranged in the same direction (e.g., the first direction). In this case, the first direction may refer to the X-axis or Y-axis direction. That is, the microlenses 400 arranged in the second microlens array (ML2) may be repeatedly arranged such that a second iterative unit is repeated and has a second width (P2). Since the second microlens array is rotated relative to the first microlens array, the second width (P2) is larger than the first width (P1), and thus, as compared to the microlenses in the first microlens array, the microlenses in the second microlens array is arranged with a larger pitch in the direction in which the microlenses in the first microlens array are arranged. In other words, the microlenses in the second microlens array arranged in the first direction are spaced farther than the microlenses in the first microlens array arranged in the first direction. As illustrated in FIG. 4A, the microlenses 400 for use in only one second width (P2) may have different heights, different widths, and different regions, and the microlenses 400 adjacent to each other may be arranged at intervals of different distances.

In some implementations, the second width (P2) may be longer than the first width (P1).

Incident light (IL) indicates the light that is incident upon the second microlens array (ML2). Reflected light (RL) indicates the light that is reflected by the microlenses 400, and backscattered light (BL) indicates the light that is reflected by the microlenses 400 with a smaller phase angle.

The backscattered light (BL) generated by the second microlens array (ML2) may cause flare phenomenon by which noise is generated in a camera system (CS) (see FIG. 14) including the image sensor 100.

The degree of flare phenomenon caused by the backscattered light (BL) may be closely associated with the second width (P2) of the second iterative unit by which the microlenses 400 are repeated in the second microlens array (ML2). As described above, the image sensor 100 may include the second microlens array (ML2) that is rotated about the axis in which the microlenses in the effective pixel region 20 are arranged by a predetermined rotation angle (θ). The flare phenomenon caused by backscattered light (BL) can be significantly reduced due to the increased width of the second iterative unit in the second microlens array (ML2). As will be discussed below (see FIG. 14), the increased width of the second iterative unit results in the increased intervals between neighboring iterative microlenses in a certain direction, thereby reducing the flare phenomenon caused by backscattered light (BL). The neighboring iterative microlenses may have substantially same heights from each other.

Figure 4B:
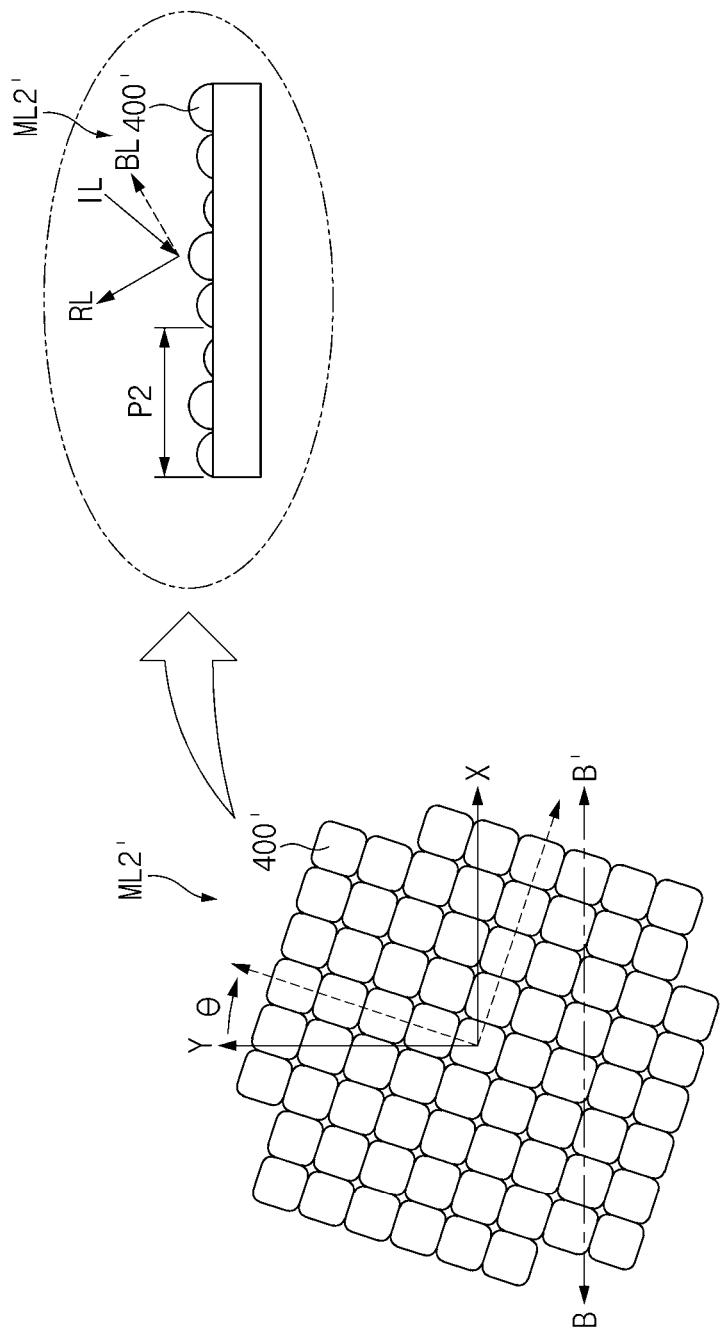
FIG. 4B is a schematic diagram illustrating another example of the second microlens array arranged in the image sensor shown in FIG. 2 based on some implementations of the disclosed technology.

FIG. 4B is a schematic diagram illustrating another example of the second microlens array arranged in the image sensor shown in FIG. 2 based on some implementations of the disclosed technology.

Referring to FIG. 4B, the second microlens array (ML2') may refer to a microlens array arranged in the image sensor 100, and the second microlens array (ML2') may be arranged in at least one of a dummy pixel region 30, a pixel shield region 50A, and a logic shield region 50B. That is, the second microlens array (ML2') may be arranged in the edge region with respect to the effective pixel region 20.

The second microlens array (ML2') may include a plurality of microlenses 400', each of which is implemented when the first microlens array (ML1') is rotated by a predetermined rotation angle (θ) on the basis of the center point of an arbitrary microlens 300' or the axis (e.g., Z-axis) perpendicular to the plane (or the first microlens array ML1') between the X-axis and the Y-axis. In other words, the second microlens array (ML2') may be implemented by rotating the first microlens array (ML1') by a predetermined rotation angle (θ).

In other words, the plurality of microlenses 300' may be arranged in a first direction (e.g., a column direction) or in a second direction (e.g., a row direction) perpendicular to the first direction in the first microlens array (ML1'), and the second microlens array (ML2') may be implemented by rotating the first microlens array (ML1') by a predetermined angle (θ) with respect to the first direction.

Each of the microlenses 400' may be formed in a rectangular shape in which each corner is curved (or rounded) in a different way from the circular shape of the microlens 400 shown in FIG. 4A.

The microlenses 400' may be formed in compliance with the same specifications (e.g., shape, width, thickness, curvature, diameter, volume). In accordance with the present embodiment of the disclosed technology, the microlenses 400' shown in FIG. 4B may be formed in compliance with the same specifications as those of the microlenses 300' shown in FIG. 3B.

Although the present embodiment of the disclosed technology has exemplarily disclosed that each of the microlenses is formed in a circular or rectangular shape for convenience of description, the scope or spirit of the microlenses is not limited thereto, and each of the microlenses may also be formed in an arbitrary shape as necessary.

Meanwhile, the cross-sectional view of the second microlens array (ML2') taken along the line B-B' parallel to the X-axis is illustrated in the right side of FIG. 4B. The cutting line B-B' of FIG. 4B and the cutting line A-A' of FIG. 3B may refer to the same direction (e.g., the first direction). In this case, the first direction may refer to the X-axis or Y-axis direction. That is, the microlenses 400' arranged in the second microlens array (ML2') may be repeatedly arranged at intervals of a second width (P2). As illustrated in FIG. 4B, the microlenses 400 for use in only one second width (P2) may have different heights, different widths, and different regions, and the microlenses 400 adjacent to each other may be arranged at intervals of different distances.

In addition, the second width (P2) may be longer than the first width (P1).

Incident light (IL) indicates the light that is incident upon the second microlens array (ML2'). Reflected light (RL) indicates the light that is reflected by the microlenses 400' and backscattered light (BL) indicates the light that is reflected by the microlenses 400'.

The backscattered light (BL) generated by the second microlens array (ML2') may cause flare phenomenon by which noise is generated in the camera system (CS) (see FIG. 14) including the image sensor 100.

The degree of flare phenomenon caused by the backscattered light (BL) may be closely associated with the second width (P2) in which the microlenses 400' are repeated in the second microlens array (ML2'). As described above, the image sensor 100 may include the second microlens array (ML2') obtained when the first microlens array (ML1') is rotated by a predetermined rotation angle (θ) in the vicinity of the edge portion on the basis of the effective pixel region 20. The flare phenomenon caused by backscattered light (BL) can be significantly reduced due to the increasing width of the second microlens array (ML2'). The reason why the flare phenomenon caused by backscattered light (BL) is reduced due to the increasing width of the second microlens array (ML2') will be described later with reference to the drawings below FIG. 14.

As described above, the second microlens array (ML2') may be implemented by rotating the first microlens array (ML1') by a predetermined rotation angle (θ), such that each second iterative unit in the second microlens array (ML2') may have the second width (P2) longer than the first width (P1) of each first iterative unit in the first microlens array (ML1') in the first direction. If the first microlens array (ML1') is not rotated by the predetermined angle (θ) and each microlens 300' is rotated about the center point thereof, the second microlens array has the first width (P1) not the second width (P2) in the first direction, such that the flare phenomenon may not be reduced in the same manner as in the second microlens array (ML2').

Figure 5:
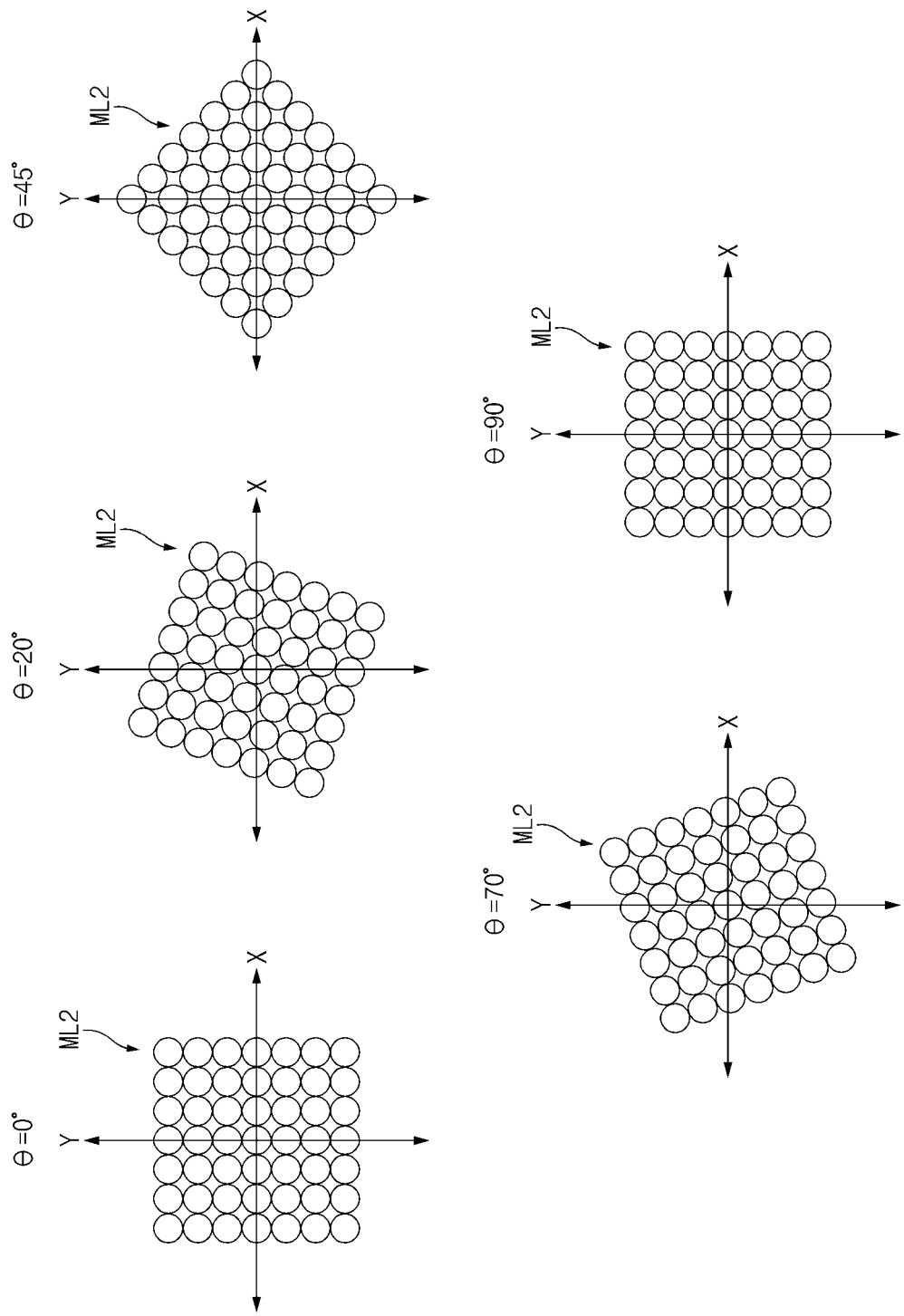
FIG. 5 show example arrangements of the second microlens array obtained through rotation of an axis of the first microlens array on a 2-dimensional plane based on some implementations of the disclosed technology.

FIG. 5 show example arrangements of the second microlens array obtained through rotation of an axis of the first microlens array on a 2-dimensional plane based on some implementations of the disclosed technology.

As illustrated in FIG. 5, the first microlens array (ML1) may be sequentially rotated by a rotation angle ranging from 0° to 90°, such that the second microlens array (ML2) can be constructed, and a detailed description thereof will hereinafter be given with reference to the attached drawings. Although the drawings below FIG. 5 illustrate various embodiments with reference to the first microlens array (ML1) of FIG. 3A and the second microlens array (ML2) of FIG. 4A for convenience of description, the scope of the disclosed technology is not limited thereto, and the same technical idea or concept can also be applied not only to the first microlens array (ML1') of FIG. 3B, but also to the second microlens array (ML2') of FIG. 4B as necessary.

In comparison between the second microlens array (ML2) rotated by a rotation angle of 20° and the other second microlens array (ML2) rotated by a rotation angle of 70°, it can be recognized that two second microlens arrays (ML2) are symmetrical to each other about an arbitrary straight line passing through the center point of the second microlens array (ML2). That is, two second microlens arrays (ML2) may have the same second width (P2) in the direction of incident light (or the cutting line).

Therefore, it can be recognized that the second microlens array (ML2) rotated by a rotation angle of 20° is optically identical to (or is identical in the same width to) the other second microlens array (ML2) rotated by a rotation angle of 70°. That is, it can be seen that the rotation angle (θ) by which the second microlens array (ML2) is constructed has the range of 0° to 45°.

Figure 6A:
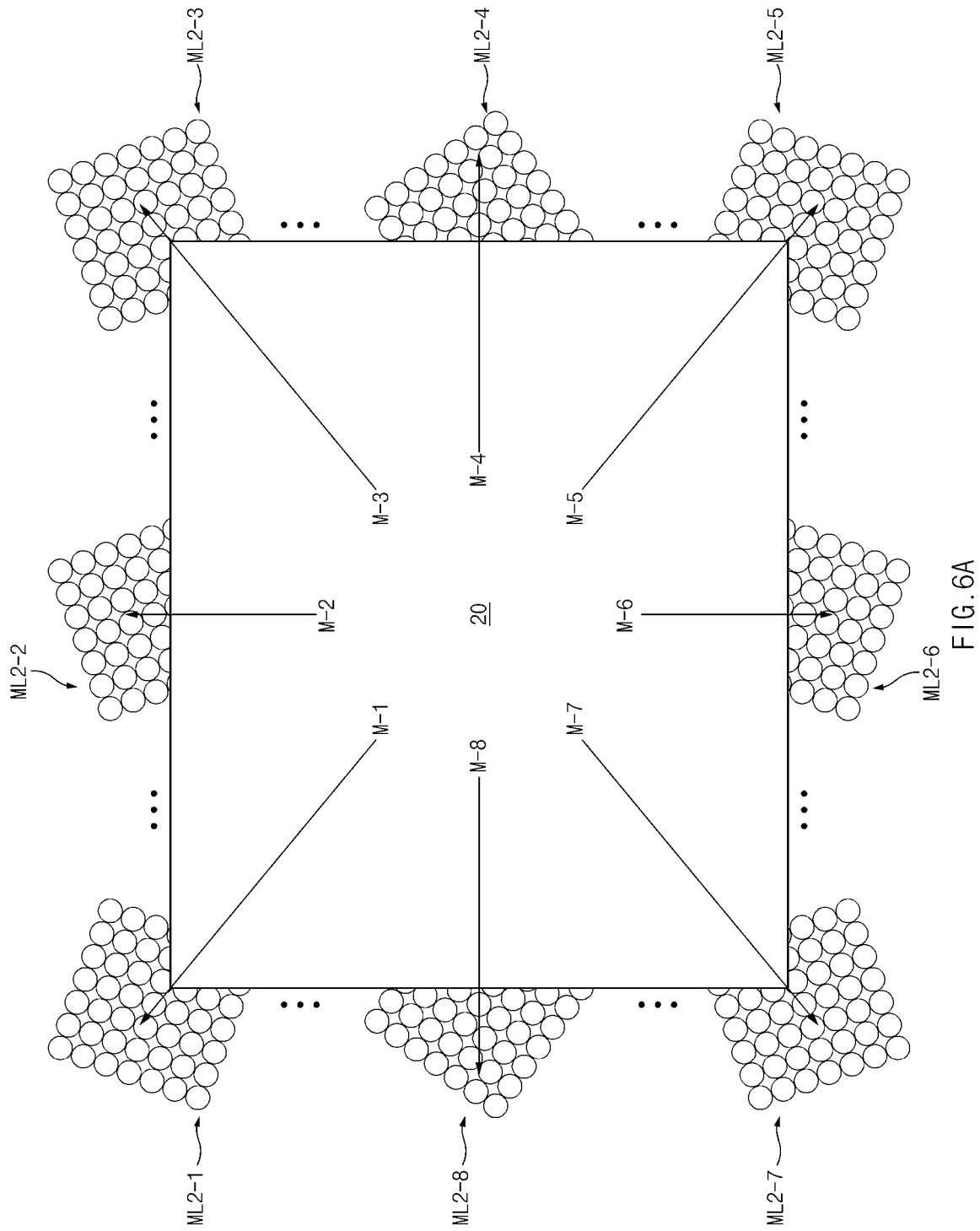
FIG. 6A shows various possible rotation angles of a plurality of the second microlens arrays aligned according to respective positions relative to adjacent the first microlens arrays based on some implementations of the disclosed technology.

FIG. 6A shows various possible rotation angles of a plurality of the second microlens arrays aligned according to respective positions relative to adjacent the first microlens arrays.

Referring to FIG. 6A, the second microlens array (ML2-1) may be arranged at the upper left side of the effective pixel region 20, the second microlens array (ML2-2) may be arranged at the top side of the effective pixel region 20, the second microlens array (ML2-3) may be arranged at the upper right side of the effective pixel region 20, the second microlens array (ML2-4) may be arranged at the right side of the effective pixel region 20, the second microlens array (ML2-5) may be arranged at the lower right side of the effective pixel region 20, the second microlens array (ML2-6) may be arranged at the lower side of the effective pixel region 20, the second microlens array (ML2-7) may be arranged at the lower left side of the effective pixel region 20, and the second microlens array (ML2-8) may be arranged at the left side of the effective pixel region 20. The plurality of second microlens arrays ML2-1 to ML2-8 may have the same rotation angle, and at least two of the second microlens arrays ML2-1 to ML2-8 may have different rotation angles.

Not only the positions of the second microlens arrays ML2-1 to ML2-8 shown in FIG. 6A, but also the arbitrary position located outside the effective pixel region 20 may be defined as a first position, and other positions adjacent to the first position may be defined as a second position.

If the arbitrary second microlens array (e.g., ML2-1) has a rotation angle different from that of the other second microlens array (e.g., ML2-2) adjacent to the arbitrary second microlens array (e.g., ML2-1), the rotation angle of the second microlens array may be gradually changed in inverse proportion to the distance from the second microlens array (e.g., ML2-1) to the other second microlens array (e.g., ML2-2). Alternatively, an empty space having a predetermined size may be present in a boundary between the arbitrary second microlens array (e.g., ML2-1) and the other second microlens array (e.g., ML2-2) adjacent to the second microlens array (e.g., ML2-1).

The rotation angles of the second microlens arrays ML2-1 to ML2-8 may be experimentally decided to minimize the flare phenomenon in consideration of the angle of incidence of a chief ray component that incurs the flare phenomenon from among chief rays M-1 to M-8 having passed through the lens module, the shape of the camera system (CS) including the image sensor 100, the shape of the second microlens array.

The eight second microlens arrays ML2-1 to ML2-8 are shown in FIG. 6A by way of example only, and each of the second microlens arrays arranged in the image sensor 100 may be divided into a number of sections.

Figure 6B:
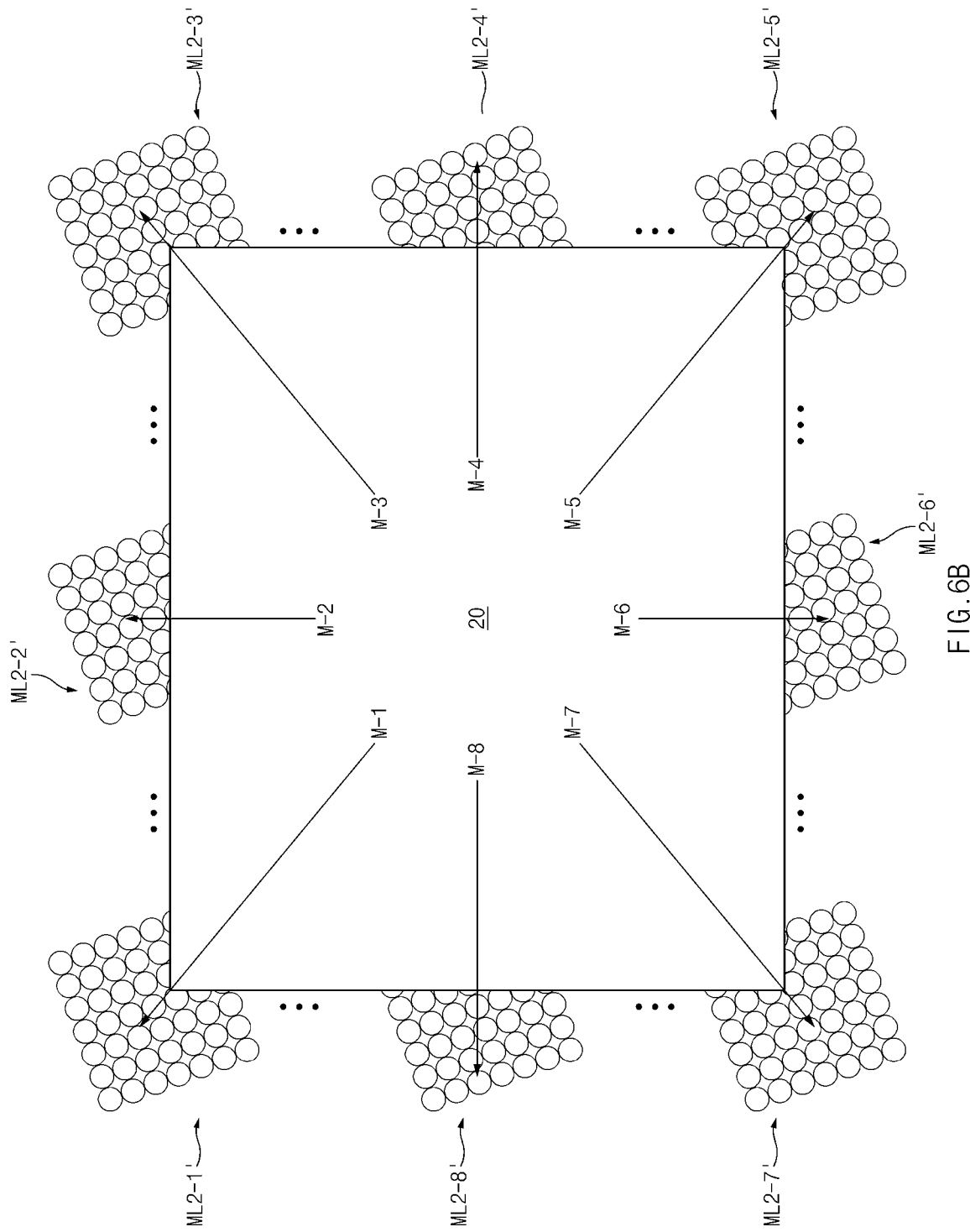
FIG. 6B shows invariable (constant) rotation angles of the second microlens array according to respective positions inside the image sensor based on some implementations of the disclosed technology.

FIG. 6B shows invariable (constant) rotation angles of the second microlens array according to respective positions inside the image sensor.

Referring to FIG. 6B, the second microlens array (ML2-1') may be arranged at the upper left side of the effective pixel region 20, the second microlens array (ML2-2') may be arranged at the top side of the effective pixel region 20, the second microlens array (ML2-3') may be arranged at the upper right side of the effective pixel region 20, the second microlens array (ML2-4') may be arranged at the right side of the effective pixel region 20, the second microlens array (ML2-5') may be arranged at the lower right side of the effective pixel region 20, the second microlens array (ML2-6') may be arranged at the lower side of the effective pixel region 20, the second microlens array (ML2-7') may be arranged at the lower left side of the effective pixel region 20, and the second microlens array (ML2-8') may be arranged at the left side of the effective pixel region 20. The plurality of second microlens arrays ML2-1' to ML2-8' may have the same rotation angle in a different way from FIG. 6A.

The rotation angles of the second microlens arrays ML2-1' to ML2-8' may be experimentally decided to minimize the flare phenomenon in consideration of the angle of incidence of a chief ray component that incurs the flare phenomenon from among chief rays M-1 to M-8 having passed through the lens module, the shape of the camera system (CS) including the image sensor 100, the shape of the second microlens array.

Figure 7:
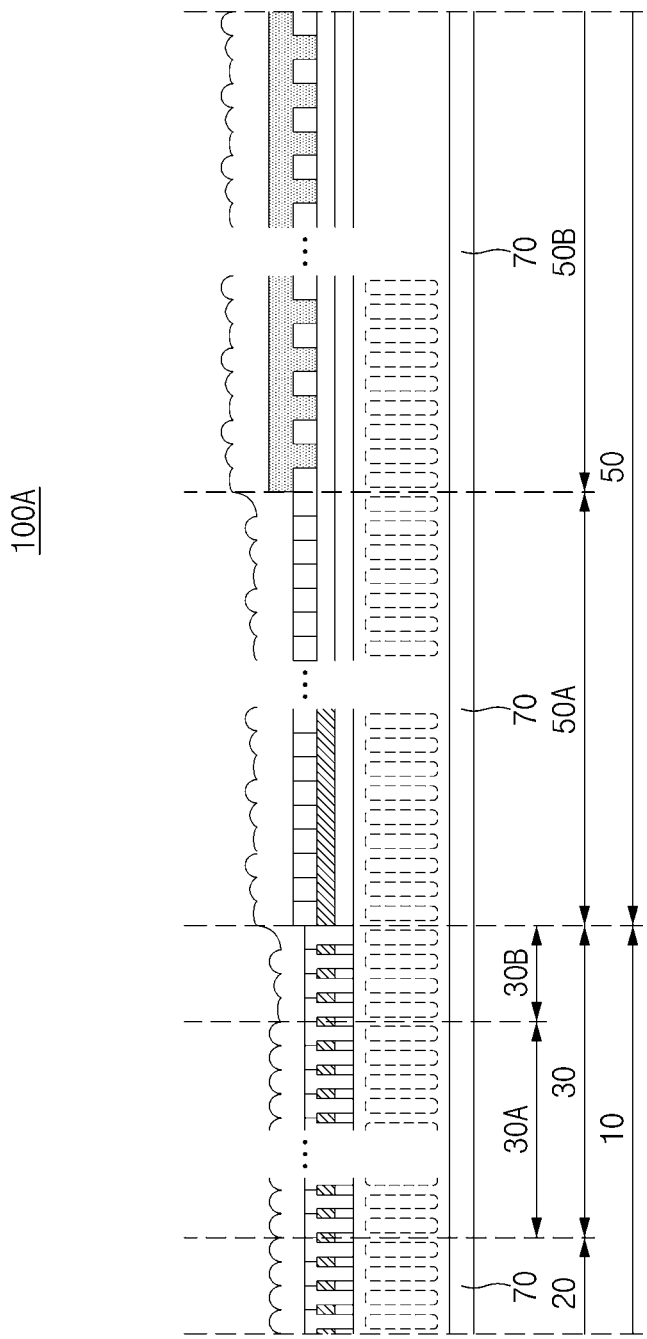
FIG. 7 is a cross-sectional view illustrating an example of the image sensor taken along the line I-I' shown in FIG. 2 based on some implementations of the disclosed technology.
Figure 8A:
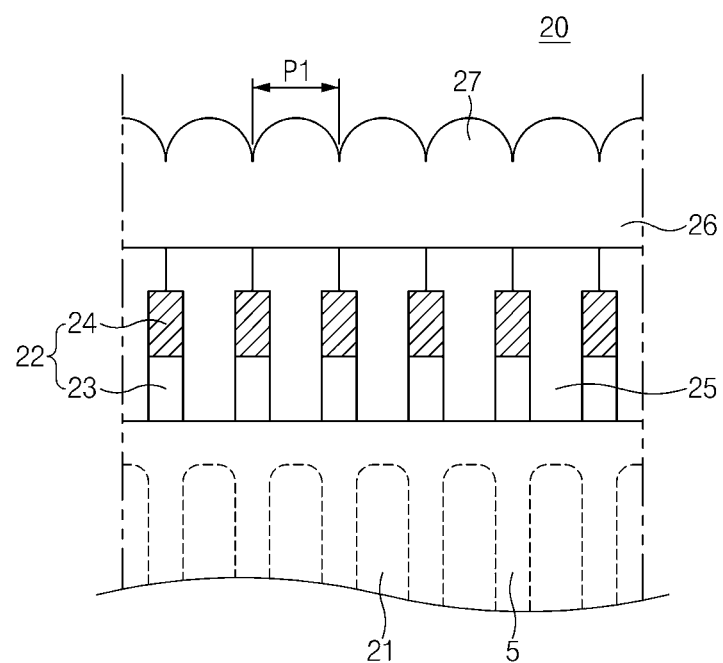
FIG. 8A is an enlarged view illustrating an effective pixel region of the image sensor shown in FIG. 7.

FIG. 7 is a cross-sectional view illustrating one example of the image sensor taken along the line I-I' shown in FIG. 2 based on some implementations of the disclosed technology. FIG. 8A is an enlarged view illustrating the effective pixel region of the image sensor shown in FIG. 7, FIG. 8B is an enlarged view illustrating the dummy pixel region of the image sensor shown in FIG. 7, FIG. 8C is an enlarged view illustrating the pixel shield region of the image sensor shown in FIG. 7, and FIG. 8D is an enlarged view illustrating the logic shield region of the image sensor shown in FIG. 7.

Referring to FIGS. 7 and 8A, the image sensor 100A may include a pixel region 10 that includes an effective pixel region 20 and an extra "dummy" pixel region 30, and may also include a shield region 50 that includes a pixel shield region 50A and logic shield regions 50B.

Referring to FIG. 8A, the effective pixel region 20 of the image sensor 100A may include effective photodiodes 21 formed in the substrate 5, effective grid patterns 22 formed over the substrate 5, effective color filters 25 formed over the substrate 5, an effective over-coating layer 26 formed over the effective color filters 25, and effective microlenses 27 formed over the effective over-coating layer 26.

Figure 8B:
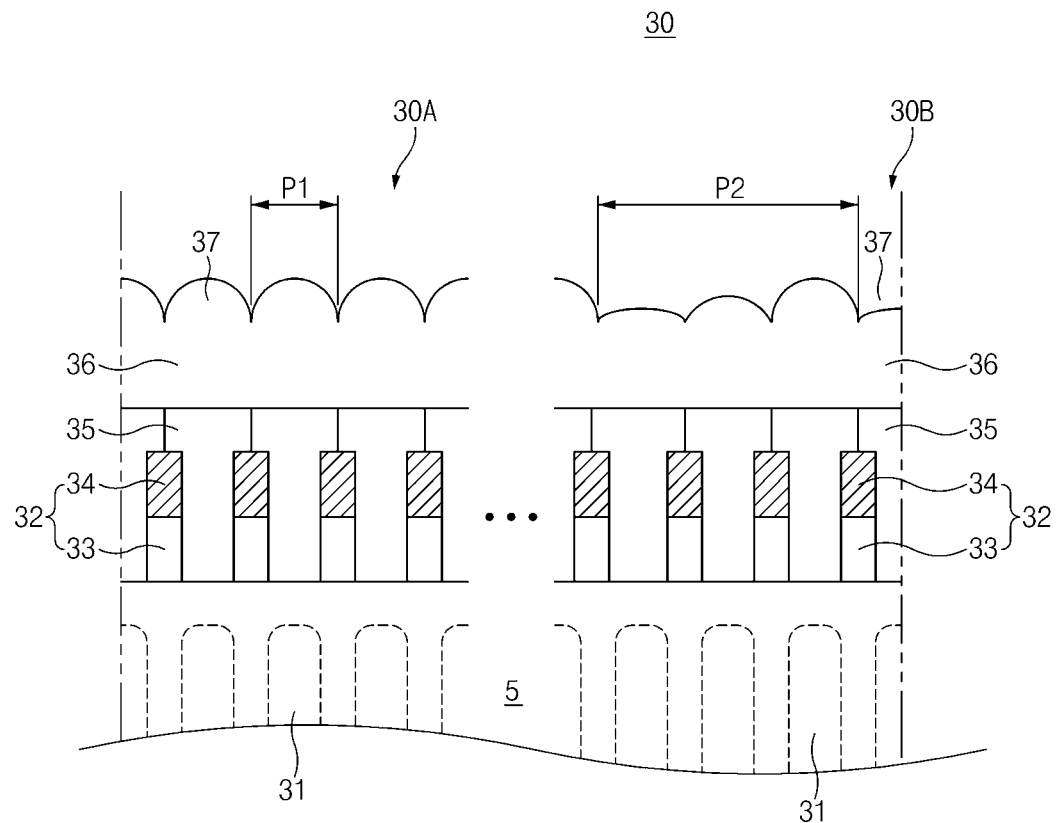
FIG. 8B is an enlarged view illustrating an extra "dummy" pixel region of the image sensor shown in FIG. 7.
Figure 8C:
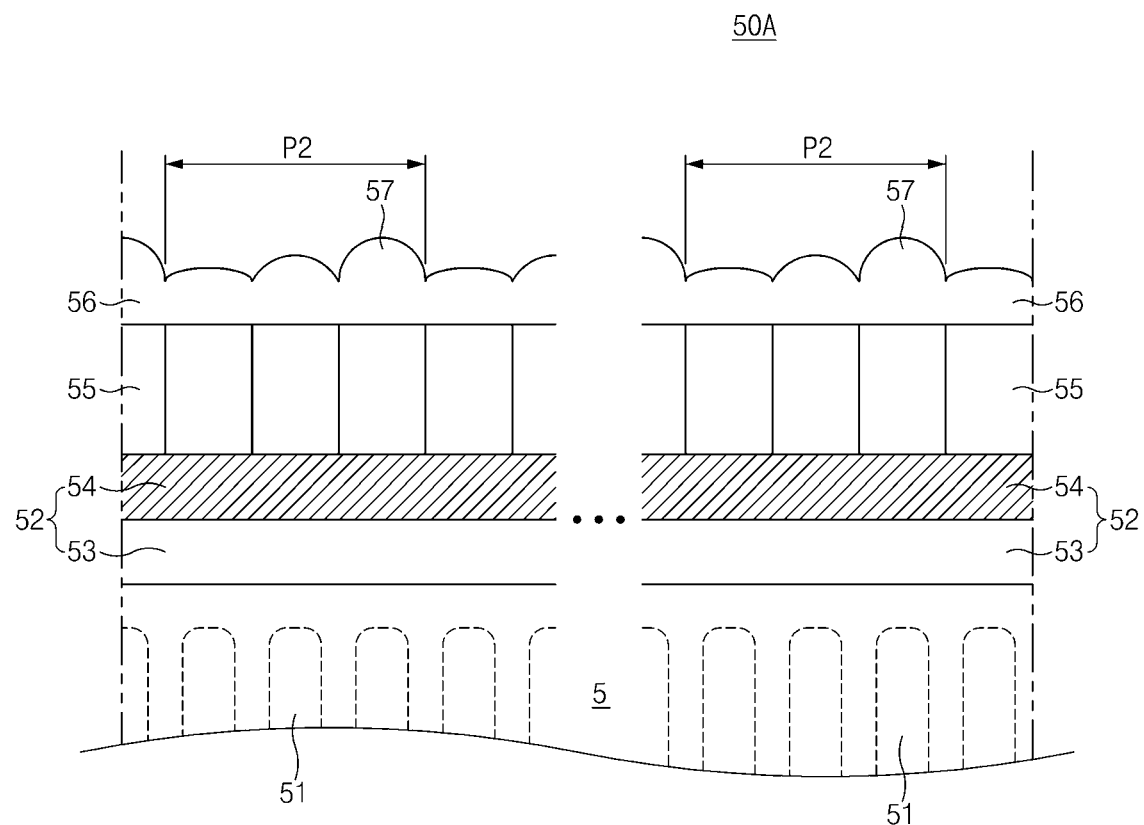
FIG. 8C is an enlarged view illustrating a pixel shield region of the image sensor shown in FIG. 7.
Figure 8D:
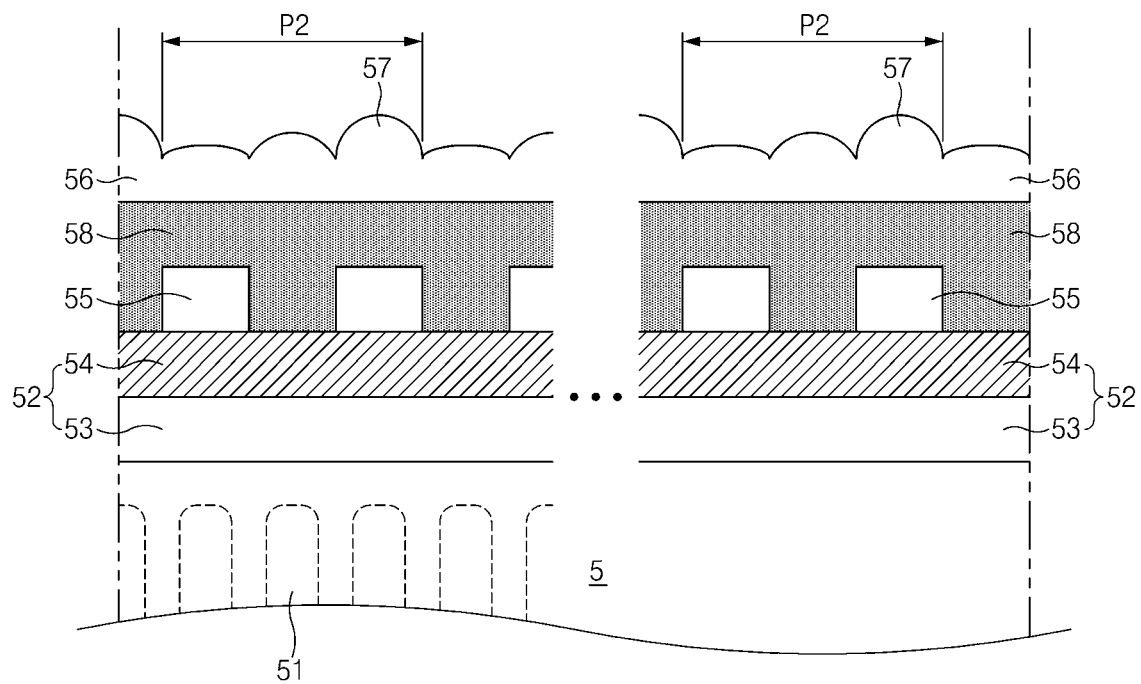
FIG. 8D is an enlarged view illustrating a logic shield region of the image sensor shown in FIG. 7.

Referring to FIGS. 7 and 8B, the dummy pixel region 30 of the image sensor 100A may include dummy photodiodes 31 formed in the substrate 5, dummy grid patterns 32 formed over the substrate 5, dummy color filters 35 formed over the substrate 5, a dummy over-coating layer 36 formed over the dummy color filter 35, and dummy microlenses 37 formed over the dummy over-coating layer 36.

Referring to FIGS. 7, 8C and 8D, the pixel shield region 50A of the image sensor 100A may include peripheral photodiodes 51 formed in the substrate 5, a shield layer 52 formed over the substrate 5, peripheral color filters 55, a peripheral over-coating layer 56, and peripheral microlenses 57. The logic shield region 50B may include a shield layer 52 formed over the substrate 5, peripheral color filters 55, a peripheral over-coating layer 56, and peripheral microlenses 57. The logic shield region 50B may further include an over-color filter 58 covering the peripheral color filters 55. In addition, the logic shield region 50B may not include the peripheral photodiodes arranged in the pixel shield region 50A. In other words, the peripheral photodiodes 55 may be formed only in the pixel shield region 50A, and may not be formed in the logic shield region 50B.

The substrate 5 may include a monocrystalline silicon layer or an epitaxial growth silicon layer. An insulation layer 70 including various transistors (not shown) and metal lines (not shown) may be formed below the substrate 50. The insulation layer 70 may include insulation materials, for example, a silicon oxide material or a silicon nitride material.

The effective photodiodes 21, the dummy photodiodes 31, and the peripheral photodiodes 51 may include N-type ion doped regions having phosphorous (P) ions or arsenic (As) ions. In accordance with another embodiment, the effective photodiodes 21, the dummy photodiodes 31, and the peripheral diodes 51 may include P-type ion doped regions having boron (B) ions.

The effective grid patterns 22 may be formed in a lattice-shaped mesh shape when viewed from the top, and the dummy grid patterns 32 may be formed in a lattice-shaped mesh shape when viewed from the top. Each of the effective grid patterns 22 may include a lower effective grid pattern 23 and an upper effective grid pattern 24, and each of the dummy grid patterns 32 may include a lower dummy grid pattern 33 and an upper dummy grid pattern 34.

The shield layer 52 may be formed in a flat board shape or in a plate shape. The shield layer 52 may include a lower shield layer 53 and an upper shield layer 52. The lower effective grid patterns 23, the lower dummy grid patterns 33, and the lower shield layer 53 may include insulation materials, for example, a silicon oxide material, a silicon oxynitride material, and/or a silicon nitride material. The upper effective grid patterns 24, the upper dummy grid patterns 34, and the upper shield layer 52 may include a metal material such as tungsten (W).

The effective color filters 25 may be formed to fill the spaces between the effective grid patterns 22. The dummy color filters 35 may be formed to fill the spaces between the dummy grid patterns 32. The peripheral color filters 55 and the over-color filter 58 may be formed over the shield layer 52. The peripheral color filters 55 are formed over the shield layer 52, such that the peripheral color filter 55 may be located at a higher level than the effective color filters 25 and the dummy color filters 35. The effective color filters 25, the dummy color filters 35, and the peripheral color filters 55 may include red color filters, green color filters, and blue color filters, respectively. In the logic shield region 50B, the peripheral color filters 55 may include red color filters and green color filters, and the over-color filter 58 may include blue color filters. The effective color filters 25, the dummy color filters 35, and the peripheral color filters 55 having the same colors may have the substantially same or similar vertical thicknesses. The effective color filters 25, the dummy color filters 35, and the peripheral color filters 55 having different colors may have different vertical thicknesses. The over-color filter 58 may have a larger vertical thickness than each of the peripheral color filters 55. Therefore, the over-color filter 58 may be formed to cover the peripheral color filters 55 within the logic shield region 50B.

The effective over-coating layer 26 may be formed over the effective color filters 25, the dummy over-coating layer 36 may be formed over the dummy color filters 35, and the peripheral over-coating layer 56 may be formed over the peripheral color filters 55 and the over color filters 58. Each of the effective over-coating layer 26, the dummy over-coating layer 36, and the peripheral over-coating layer 56 may have a planar top surface. Since the over-color filter 58 arranged in the logic shield region 50B has a larger thickness than the peripheral color filters 55, the peripheral overcoating layer 56 arranged in the logic shield region 50B may be formed at a higher level than the peripheral over-coating layer 56 arranged in the pixel shield region 50A. Each of the effective over-coating layer 26, the dummy over-coating layer 36, and the peripheral over-coating layer 56 may include polymeric materials.

The effective microlenses 27 may be formed over the effective over-coating layer 26. The dummy microlenses 37 may be formed over the dummy microlenses 37. The peripheral microlenses 57 may be formed over the peripheral over-coating layer 56. The effective microlenses 27 may be formed of the same materials as those of the effective over-coating layer 26, the dummy microlenses 37 may be formed of the same materials as those of the dummy over-coating layer 36, and the peripheral microlenses 57 may be formed of the same materials as those of the peripheral over-coating layer 56.

Referring to FIG. 8A, in the effective pixel region 20, the effective microlenses 27 may be arranged repeatedly and side-by-side. In some implementations, the effective pixel region 20 may include a set of iterative units such that each iterative unit includes one microlens. Each iterative unit has the first width (P1). For example, the horizontal width (e.g., the diameter) of each microlens 27 may be substantially identical to the first width (P1). In other words, the effective microlenses 27 may be arranged repeatedly and side-by-side at intervals of the first width (P1) within the effective pixel region 20.

Referring to FIG. 8B, in the dummy pixel region 30, the dummy microlenses 37 may be arranged repeatedly and side-by-side at intervals of the first width (P1). For example, in the dummy pixel region 30A arranged in the dummy pixel region 30 located close to the effective pixel region 20, the dummy microlenses 37 may be arranged at intervals of the first width (P1) in the same manner as in the effective microlenses 27. In addition, in the dummy pixel region 30B located outside the dummy pixel region 30 located close to the shield region 50, the dummy microlenses 37 may be repeatedly arranged at intervals of the second width (P2) different from the first width (P1). In other words, in the dummy pixel region 30, the dummy microlenses 37 may be repeatedly arranged at intervals of the second width (P2). For convenience of description, the second width (P2) may be at least three times longer than the first width (P1). In more detail, assuming that the first width (P1) is set to 1 µm, the second width (P2) may be set to 3 µm or greater. According to the relative concept of the disclosed technology, the inner dummy pixel region 30A may be located relatively closer to the effective pixel region 20, the outer dummy pixel region 30B may be located relatively closer to the shield region 50, and a boundary between the inner dummy pixel region 30A and the outer dummy pixel region 30B may be determined at random.

Referring to FIGS. 8C and 8D, in each of the pixel shield region 50A and the logic shield region 50B, the peripheral microlenses 57 may be repeatedly arranged at intervals of the second width (P2).

In summary, the effective microlenses 27 may be repeatedly arranged at intervals of the first width (P1) in the effective pixel region 20 of the pixel region 10, and the dummy microlenses 37 may be repeatedly arranged at intervals of the first width (P1) in the inner dummy pixel region 30A. In other words, the effective microlenses 27 arranged in the effective pixel region 20 and the dummy microlenses 37 arranged in the inner dummy pixel region 30A may correspond to the first microlens array (ML1).

In each of the outer dummy pixel region 30A of the pixel region 10, and the pixel shield region 50A and the logic shield region 50B of the shield region 50, the dummy microlenses 37 and the peripheral microlenses 57 may be repeatedly arranged at intervals of the second width (P2). That is, the dummy microlenses 37 arranged in the outer dummy pixel region 30A, and the peripheral microlenses 57 arranged in the pixel shield region 50A and the logic shield region 50B may correspond to the second microlens array (ML2).

The effective microlenses 27, the dummy microlenses 37, and the peripheral microlenses 57 may be formed in compliance with the same specifications (e.g., shape, width, thickness, curvature, diameter, volume).

In accordance with one example of the disclosed technology, the dummy microlenses 37 located at the same chief rays M-1 to M-8 may have different rotation angles, and the peripheral microlenses 57 located at the same chief rays M-1 to M-8 may also have different rotation angles, such that the flare phenomenon can be minimized.

Figure 9:
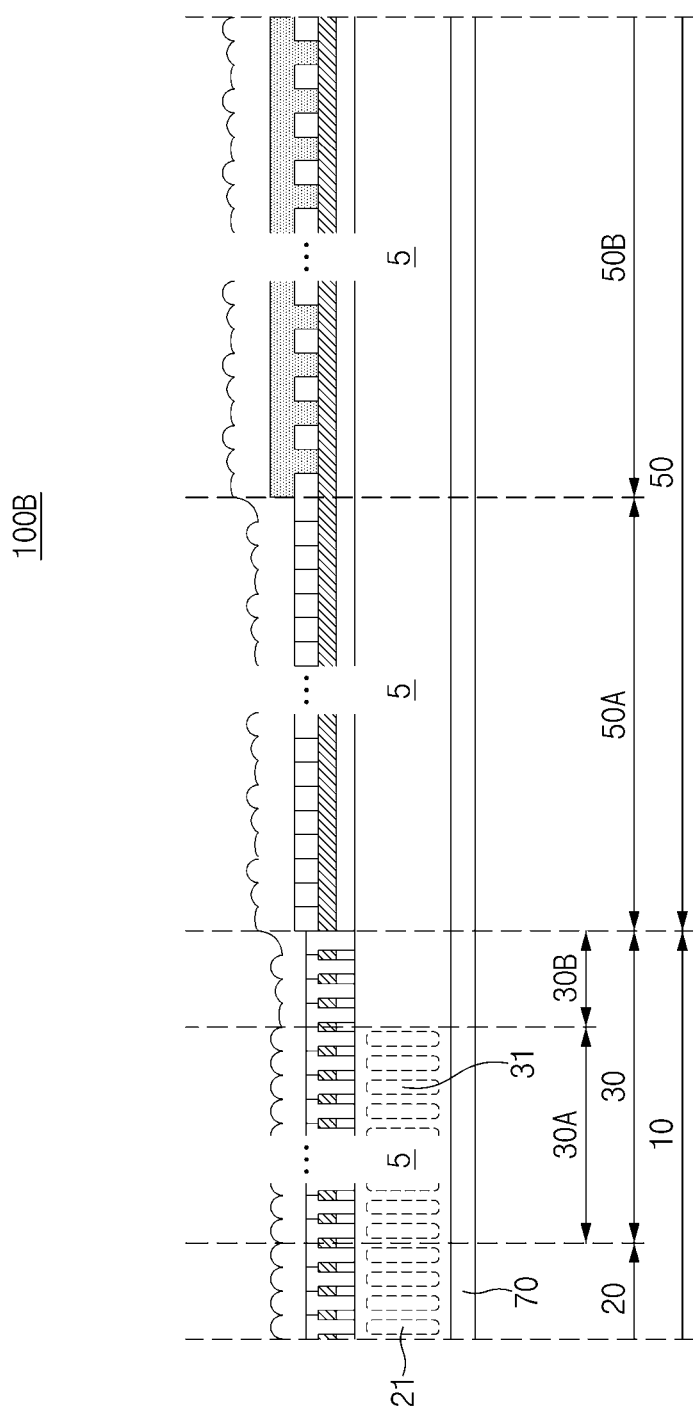
FIG. 9 is a cross-sectional view illustrating another example of the image sensor taken along the line I-I' shown in FIG. 2 based on some implementations of the disclosed technology.

FIG. 9 is a cross-sectional view illustrating another example of the image sensor taken along the line I-I' shown in FIG. 2 based on some implementations of the disclosed technology.

Referring to FIG. 9, the image sensor 100B according to another embodiment of the disclosed technology may include a pixel region 10 and a shield region 50. The pixel region 10 may include an effective pixel region 20 provided with effective photodiodes 21 and a dummy pixel region 30 provided with dummy photodiodes 31. The shield region 50 may include a pixel shield region 50A and a logic shield region 50B. In comparison with the image sensor 100A shown in FIG. 7, the photodiodes 55 shown in FIG. 7 may be omitted from the shield region 50 as illustrated in FIG. 9. In addition, according to another embodiment of the disclosed technology, the dummy photodiodes 31 may be partially formed in or omitted from the dummy pixel region 30 of the image sensor 100B. In more detail, as compared to FIG. 8B, the dummy photodiodes 31 may be formed in the inner dummy pixel region 30A located close to the effective pixel region 20, and the dummy photodiodes 31 may be omitted from the outer dummy pixel region 30B located close to the shield region 50.

Figure 10:
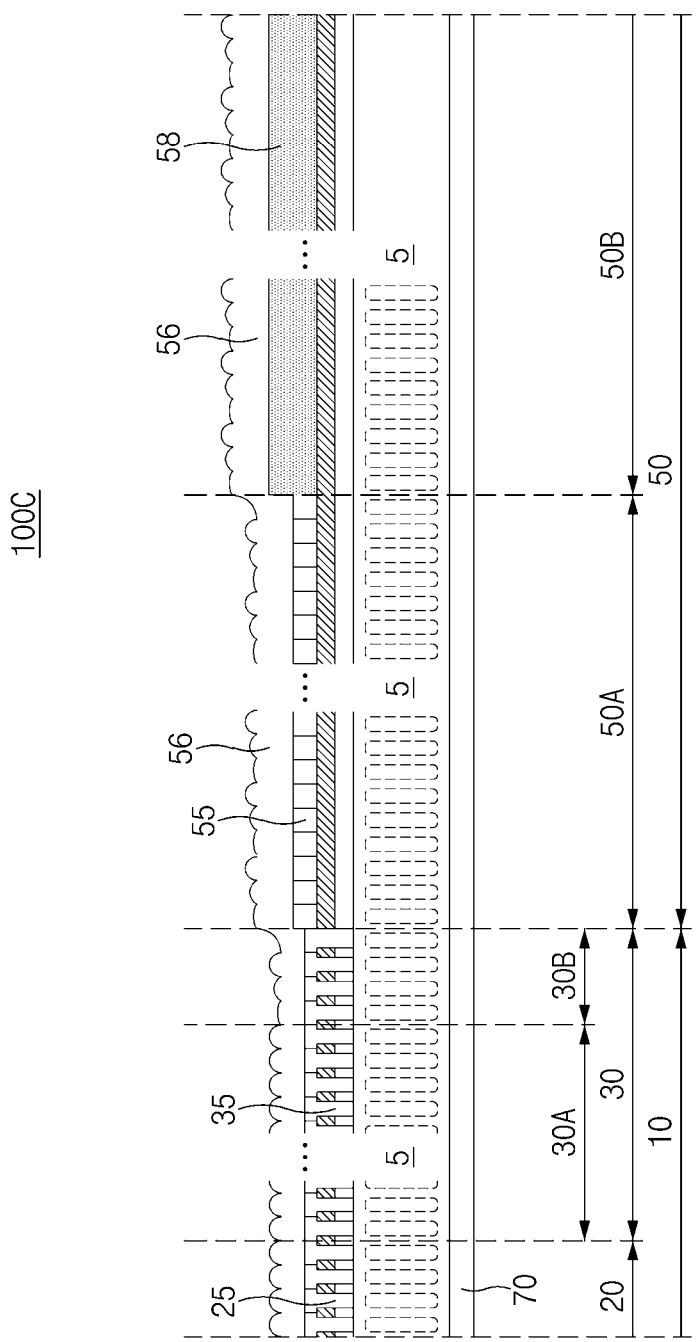
FIG. 10 is a cross-sectional view illustrating another example of the image sensor taken along the line I-I' shown in FIG. 2 based on some implementations of the disclosed technology.

FIG. 10 is a cross-sectional view illustrating another example of the image sensor taken along the line I-I' shown in FIG. 2.

Referring to FIG. 10, the image sensor 100C according to another embodiment of the disclosed technology may include a pixel region 10, a pixel shield region 50A, and a logic shield region 50B. The pixel region 10 may include an effective pixel region 20 provided with effective color filters 25 and a dummy pixel region 30 provided with dummy color filters 35. The pixel shield region 50A may include peripheral color filters 55. The logic shield region 50B may include an over-color filter 58. As compared to the image sensor 100A shown in FIG. 7, the peripheral color filters 55 shown in FIG. 7 may not be formed in the logic shield region 50B, and may be omitted from the logic shield region 50B as illustrated in FIG. 10. That is, only the over-color filter 58 may be formed in the logic shield region 50B.

Figure 11:
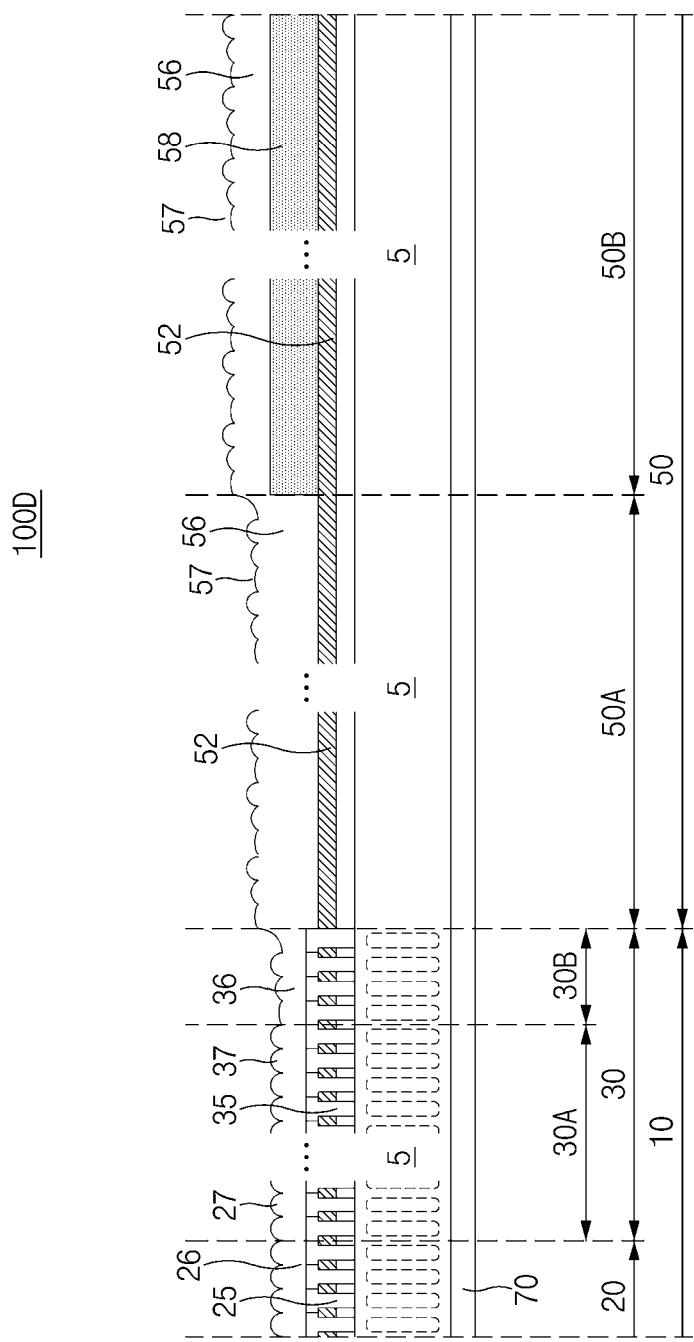
FIG. 11 is a cross-sectional view illustrating another example of the image sensor taken along the line I-I' shown in FIG. 2 based on some implementations of the disclosed technology.

FIG. 11 is a cross-sectional view illustrating another example of the image sensor taken along the line I-I' shown in FIG. 2 based on some implementations of the disclosed technology.

Referring to FIG. 11, the image sensor 100D according to another embodiment of the disclosed technology may include a pixel region 10, a pixel shield region 50A not provided with peripheral color filters 55, and a logic shield region 50B. In this case, the pixel region 10 may include an effective pixel region 20 provided with effective color filters 25 and a dummy pixel region 30 provided with dummy color filters 35. In comparison with the image sensor 100A shown in FIG. 7, the peripheral color filters 55 shown in FIG. 7 may not be formed in the pixel shield region 50A and the logic shield region 50B, and may be omitted from the pixel shield region 50A and the logic shield region 50B. The over-color filter 58 may be formed in the logic shield region 50B. That is, the peripheral over-coating layer 56 may be directly formed over the shield layer 52 in the pixel shield region 50A, the over-color filter 58 may be formed over the shield layer 52 in the logic shield region 50B, and the peripheral over-coating layer 56 may be formed over the over-color filter 58.

Figure 12:
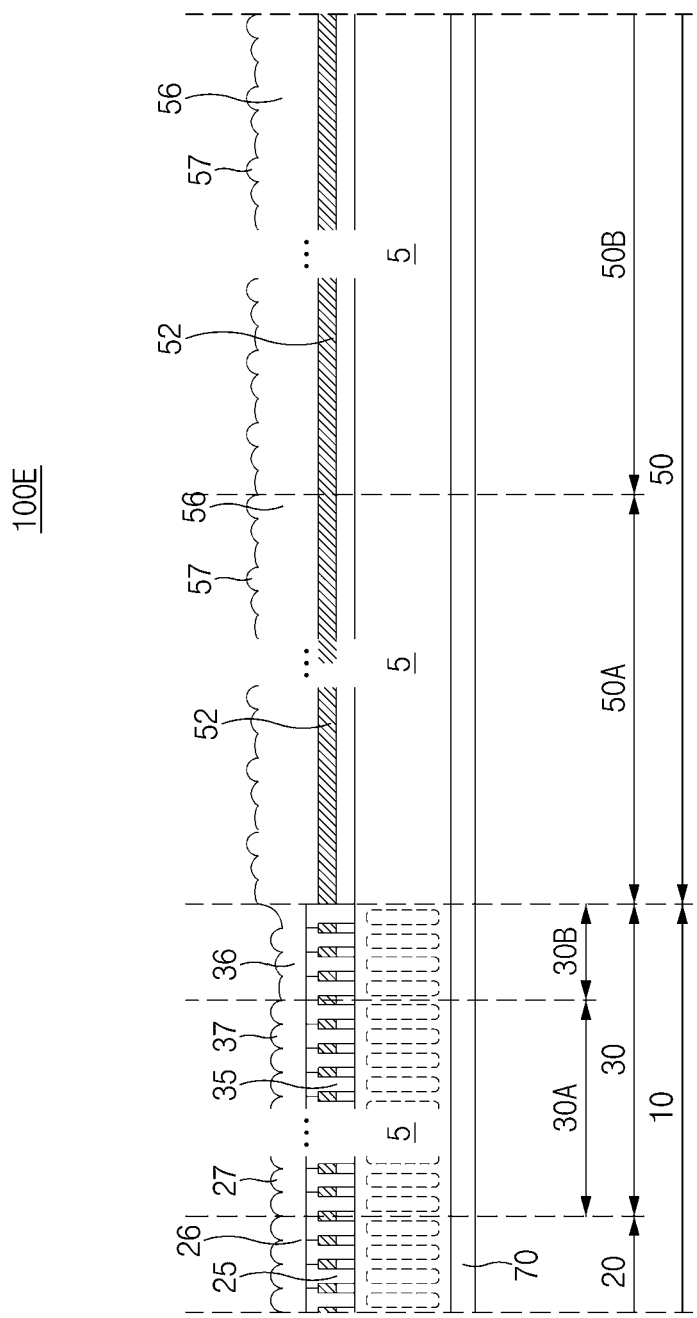
FIG. 12 is a cross-sectional view illustrating another example of the image sensor taken along the line I-I' shown in FIG. 2 based on some implementations of the disclosed technology.

FIG. 12 is a cross-sectional view illustrating another example of the image sensor taken along the line I-I' shown in FIG. 2 based on some implementations of the disclosed technology.

Referring to FIG. 12, the image sensor 100E according to another embodiment of the disclosed technology may include a pixel region 10 and a shield region 50. The pixel region 10 may include an effective pixel region 20 and a dummy pixel region 30. The shield region 50 may include a pixel shield region 50A and a logic shield region 50B, each of which has the over-coating layer 56 directly formed over the shield layer 52. In comparison with the image sensor 100A shown in FIG. 7, the peripheral color filters 55 and the over-color filter 58 may not be formed in the pixel shield region 50A and the logic shield region 50B, and may be omitted from the pixel shield region 50A and the logic shield region 50B.

Figure 13:
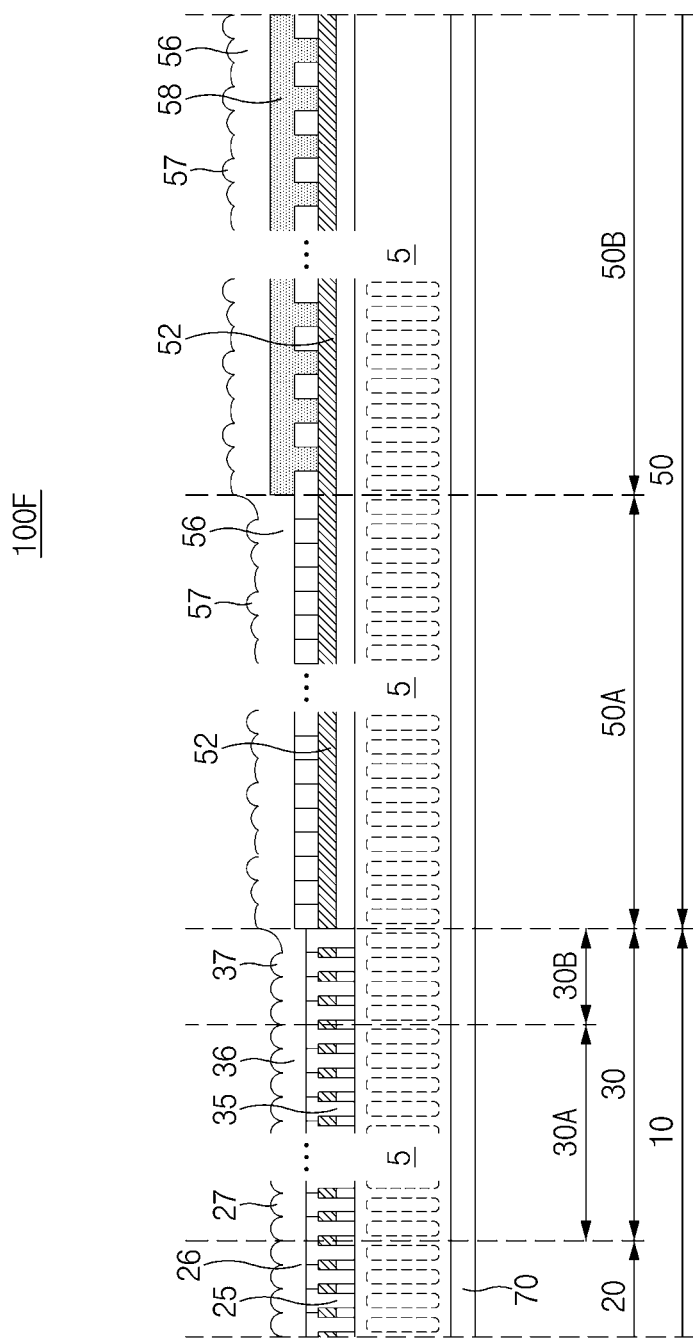
FIG. 13 is a cross-sectional view illustrating another example of the image sensor taken along the line I-I' shown in FIG. 2 based on some implementations of the disclosed technology.

FIG. 13 is a cross-sectional view illustrating another example of the image sensor taken along the line I-I' shown in FIG. 2 based on some implementations of the disclosed technology.

Referring to FIG. 13, the image sensor 100F according to another embodiment of the disclosed technology may include a pixel region 10 and a shield region 50. The pixel region 10 may include an effective pixel region 20 provided with effective photodiodes 21 and a dummy pixel region 30 provided with dummy photodiodes 31. The shield region 50 may include a pixel shield region 50A and a logic shield region 50B, each of which includes the peripheral microlenses 57. In comparison with the image sensor 100A shown in FIG. 7, in the dummy pixel region 30, the dummy microlenses 37 may be repeatedly arranged at intervals of the first width (P1) without distinction between the inner dummy pixel region 30A and the outer dummy pixel region 30B as illustrated in FIG. 13.

Figure 14:
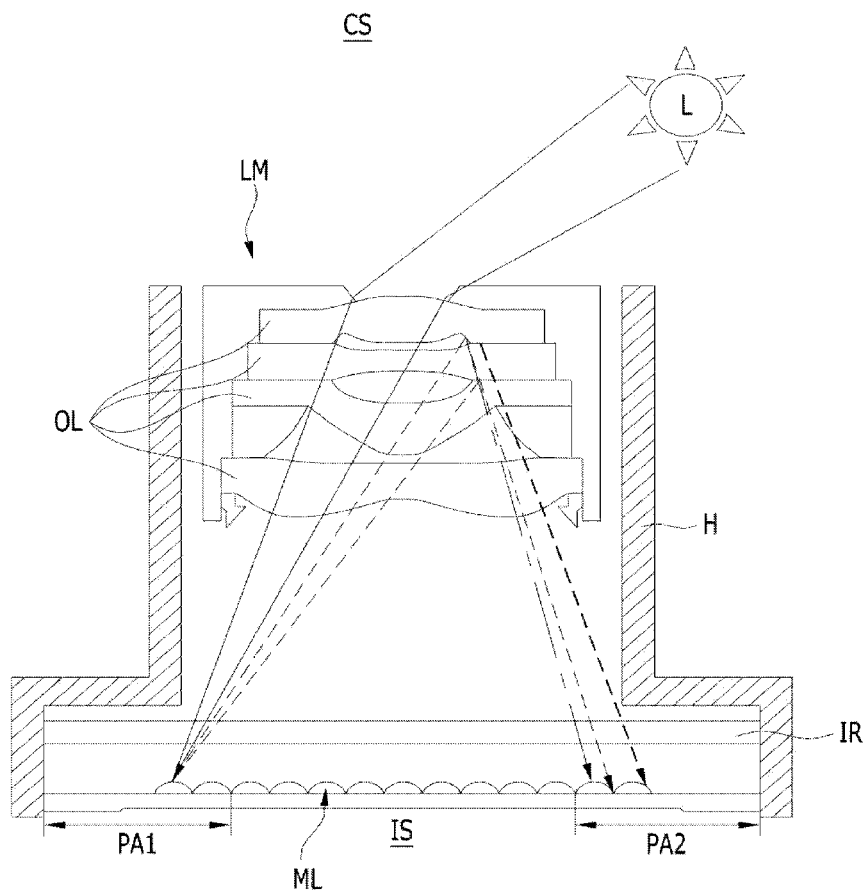
FIG. 14 is a schematic diagram illustrating an example of a camera system for explaining backscattering of incident light based on some implementations of the disclosed technology.

FIG. 14 is a schematic diagram illustrating an example of a camera system (CS) for explaining backscattering of incident light (IL) based on some implementations of the disclosed technology.

Referring to FIG. 14, the camera system (CS) may include a housing (H), a lens module (LM), an infrared filter (IR), and an image sensor (IS). The lens module (LM), the infrared filter (IR), and the image sensor (IS) may be arranged in the housing (H). The infrared filter (IR) may filter out infrared light, and the lens module (LM) may include a plurality of optical lenses (OL). For example, light irradiated onto the first peripheral region (PA1) of the image sensor (IS) from among plural lights incident from any one of a light source (L) and a target object to the lens module (LM) of the camera system (CS) may be backscattered from the microlenses (ML), may be reflected from the optical lenses of the lens module (LM), and may be reflected again, such that the resultant light can be radiated onto the second peripheral region (PA2) of the image sensor (IS). The first peripheral region (PA1) and the second peripheral region (PA2) may be located close to corners facing each other in a diagonal direction from the image sensor (IS).

Figure 15:
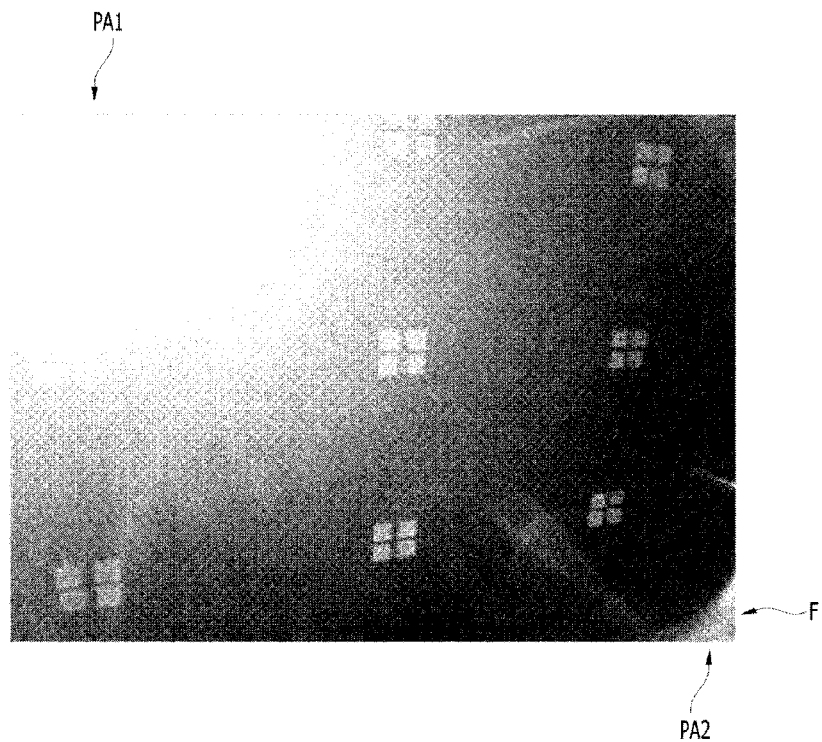
FIG. 15 is a photo image illustrating an example of an image captured by the camera system including a conventional image sensor.

FIG. 15 is a photo image illustrating an example of an image captured by the camera system (CS) including a conventional image sensor.

Referring to FIGS. 14 and 15, light incident upon the first peripheral region (PA1) may be backscattered to the optical lenses (OL) of the lens module (LM), and may then be re-incident upon the second peripheral region (PA2). Therefore, the flare phenomenon may occur in the second peripheral region (PA2). The flare phenomenon (F) has been measured as the most dominant component of the backscattered light (BL) having a specific angle.

Figure 16A:
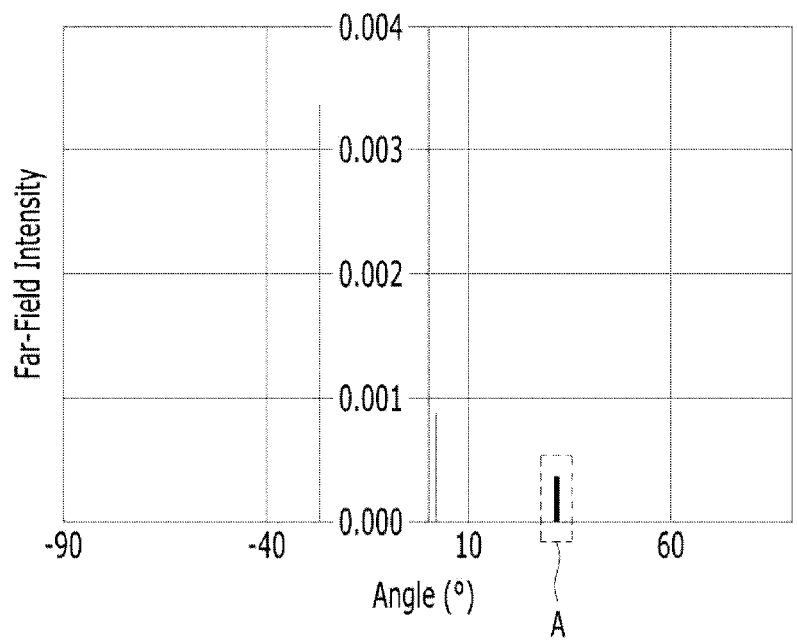
FIG. 16A is a graph illustrating far-field intensity values changeable according to backscattered light (BL) angles measured by the camera system including the conventional image sensor.
Figure 16B:
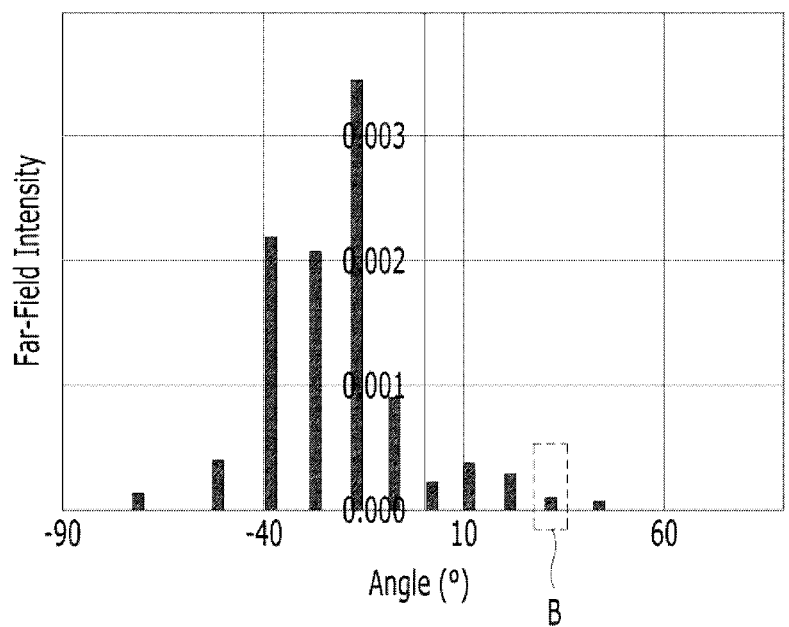
FIG. 16B is a graph illustrating far-field intensity values changeable according to backscattered light (BL) angles measured by a camera system including any one of image sensors based on some implementations of the disclosed technology.
Figure 16C:
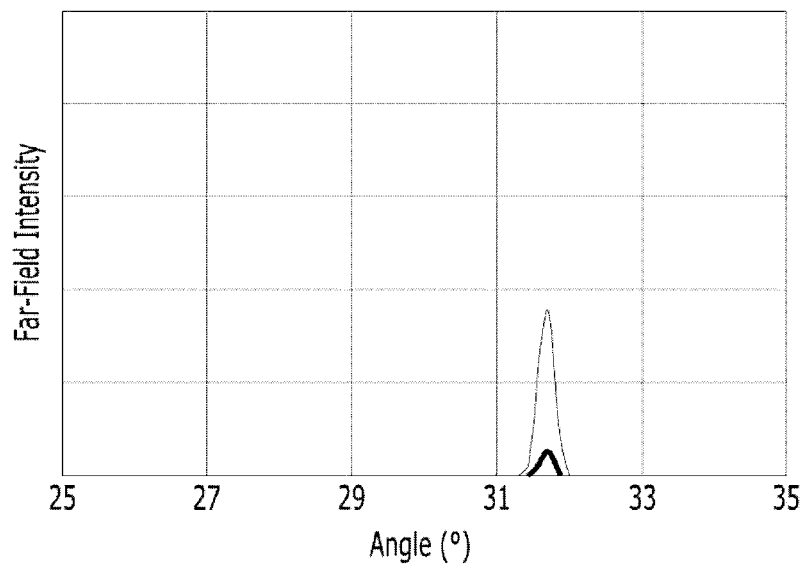
FIG. 16C is a graph illustrating the result of enlarging far-field intensity values of backscattered light (BL) having a specific angle causing the flare phenomenon (shown in FIG. 15) as shown in FIG. 16A and FIG. 16B, and the result of comparison between the enlarged far-field intensity values of FIG. 16A and the enlarged far-field intensity values of FIG. 16B.

FIG. 16A is a graph illustrating far-field intensity values changeable according to backscattered light (BL) angles measured by the camera system (CS) including the conventional image sensor. FIG. 16B is a graph illustrating far-field intensity values changeable according to backscattered light (BL) angles measured by the camera system (CS) including any one of image sensors 100A to 100F. FIG. 16C is a graph illustrating the result of enlarging far-field intensity values of backscattered light (BL) having a specific angle causing the flare phenomenon (shown in FIG. 15) as shown in FIG. 16A and FIG. 16B, and the result of comparison between the enlarged far-field intensity values of FIG. 16A and the enlarged far-field intensity values of FIG. 16B.

In the graphs shown in FIGS. 16A to 16C, X-axis values may refer to angles of the backscattered light (BL), and Y-axis values may refer to squares ($E^2$) of the far-field intensity value.

Referring to the camera system (CS) including the conventional image sensor shown in FIG. 16A, it can be recognized that backscattered light (BL) having an angle of about (−)27°, backscattered light (BL) having an angle of about (+)2°, and backscattered light (BL) having an angle of about (+)31.5° have been generated. Specifically, the region (A) may refer to the backscattered light (BL) incurring the flare phenomenon (F) of FIG. 15, and the angle of the region (A) may correspond to the angle of incidence of a main component incurring the flare phenomenon (F).

Referring to FIG. 16B, in the camera system (CS) including any one of the image sensors 100A to 100F according to various embodiments of the disclosed technology, it can be recognized that plural backscattered lights have been generated at various angles. Specifically, as can be seen from the region (B), it can be recognized that far-field intensity values of the backscattered light (BL) incurring the flare phenomenon (F) of FIG. 15 have been significantly reduced.

Referring to FIG. 16C, in comparison with the far-field intensity values of the backscattered light (BL) of the region (A) measured by the camera system (CS) including the conventional image sensor shown in FIG. 16A, it can be recognized that the far-field intensity values of the backscattered light (BL) of the region (B) measured by the camera system (CS) including any one of the image sensors 100A to 100F have been significantly reduced as shown in FIG. 16C.

Therefore, in the camera system (CS) including any one of the image sensors 100A to 100F according to various embodiments of the disclosed technology, the flare phenomenon (F) shown in FIG. 15 may be greatly weakened such that the flare phenomenon (F) may disappear or be negligible. In FIG. 16B, the remaining backscattered lights (BL) other than the backscattered light (BL) of the region (B) may not incur the flare phenomenon (F) at all, such that the remaining backscattered lights (BL) are negligible.

As the second width (P2) of the second iterative unit of the second microlens array (ML2) is longer than the first width (P1) of first iterative unit of the first microlens array (ML1), a diffraction order may be increased (where, $2\pi m/a$ is constant, 'm' is a diffraction order, and 'a' is a width). In addition, as the diffraction order is gradually increased, power (or intensity) of the backscattered light (BL) is gradually weakened. As a result, the remaining backscattered lights (BL) other than the backscattered light (BL) of the region (B) can be neglected as described above.

The flare phenomenon (F) of FIG. 15 may occur at various positions of the image sensors 100A to 100F according to specifications, width, etc. of the microlenses 27, 37 and 57 of the image sensors 100A to 100F according to various embodiments of the disclosed technology. For example, in a situation in which the horizontal width of each of the microlenses 27, 37 and 57 is set to about 1.12 µm, if each of the width of each microlens 37 and the width of each peripheral microlens 57 is about three times the width of each effective microlens 27, the flare phenomenon (F) has been significantly reduced as shown in FIG. 16C. Therefore, in a situation in which specifications, width, etc. of the microlenses 27, 37 and 57 are changed, each of the width of each dummy microlens 37 and/or the width of each peripheral microlens 57 may be configured to have various multiples so as to minimize the flare phenomenon (F).

Figure 17:
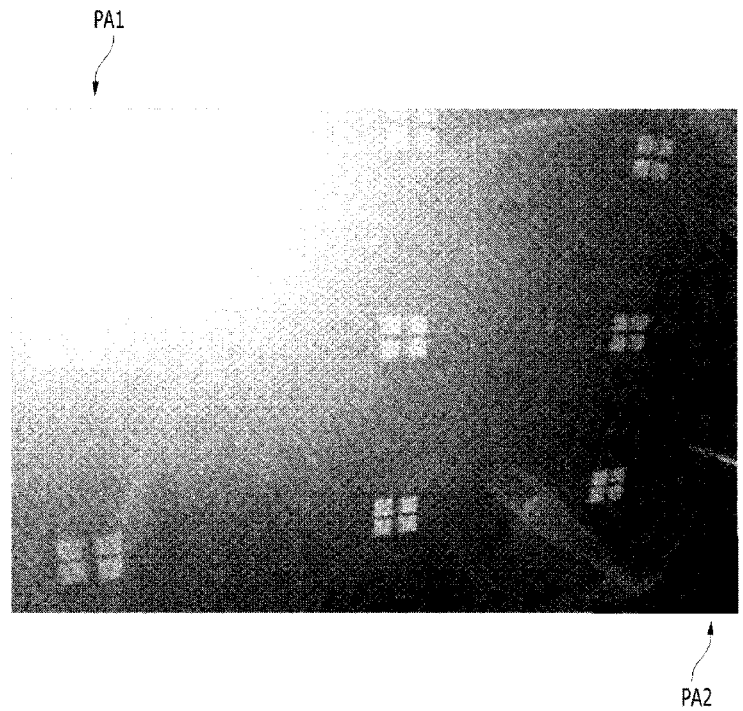
FIG. 17 is a photo image illustrating an example of an image captured by the camera system including any one of image sensors based on some implementations of the disclosed technology.

FIG. 17 is a photo image illustrating an example of an image captured by the camera system (CS) including any one of image sensors 100A to 100F based on some implementations of the disclosed technology.

Referring to FIG. 17, the flare phenomenon (F) may be minimized or removed from the second peripheral region (PA2) shown in FIG. 15.

As is apparent from the above description, the image sensor implemented based on the embodiments of the disclosed technology can reduce noise by minimizing flare phenomenon occurring due to backscattered light (BL) from the microlens.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. An image sensor comprising:
   a pixel region including a first microlens array that includes microlenses arranged in a first direction and a second direction perpendicular to the first direction; and
   a shield region configured to surround the pixel region, and configured to include a second microlens array that includes microlenses arranged in a third direction and a fourth direction perpendicular to the third direction, wherein the third direction is rotated by a predetermined angle with respect to the first direction,
   wherein adjacent microlenses in the first microlens array are in contact with each other,
   wherein the first microlens array has a first iterative unit having a first width in the first direction, and the second microlens array has a second iterative unit having a second width different from the first width in the first direction,
   wherein the first iterative unit includes one microlens, and the second iterative unit includes a plurality of microlens having different heights.

2. The image sensor according to claim 1, wherein the second width is longer than the first width.

3. The image sensor according to claim 1, wherein:
   a rotation angle between the first microlens array and the second microlens array ranges from 0° to 45°.

4. The image sensor according to claim 1, wherein the predetermined angle includes different rotation angles depending on a location of the second microlens array in the shield region, and
   a first rotation angle of the second microlens array located at a first position of the shield region is different from a second rotation angle of the second microlens array located at a second position of the shield region.

5. The image sensor according to claim 4, wherein:
   the rotation angles between the first position and the second position gradually change from the first rotation angle to the second rotation angle.

6. The image sensor according to claim 4, wherein the first rotation angle is determined based on, among chief rays incident on the first position, an angle of incidence of a light ray component associated with flare phenomenon.

7. The image sensor according to claim 1, wherein:
   the pixel region includes an effective pixel region located at a center part thereof, and a dummy pixel region formed to surround the effective pixel region, and
   wherein the effective pixel region includes:
   effective photodiodes formed in a substrate;
   effective grid patterns disposed over the substrate;
   effective color filters disposed in spaces between the effective grid patterns;
   an effective over-coating layer formed over the effective color filters; and
   effective microlenses formed over the effective over-coating layer, and
   wherein the dummy pixel region includes:
   dummy photodiodes formed in the substrate;
   dummy grid patterns disposed over the substrate;
   dummy color filters disposed in spaces between the dummy grid patterns;
   a dummy over-coating layer formed over the dummy color filters; and dummy microlenses formed over the dummy overcoating layer, whereby the first microlens array includes the effective microlenses and the dummy microlenses.

8. The image sensor according to claim 1, wherein:

the shield region includes a first shield region and a second shield region surrounding the first shield region, wherein each of the first shield region and the second shield region includes:

a shield layer disposed over a substrate;

a peripheral over-coating layer disposed over the shield layer; and peripheral microlenses disposed over the peripheral over-coating layer, and wherein the second microlens array includes the peripheral microlenses.

9. The image sensor according to claim 8, wherein:

the first shield region further includes peripheral color filters formed over the shield layer; and the second shield region further includes an over-color filter formed over the shield layer, and wherein the over-color filter has a larger vertical thickness than the peripheral color filters.

10. The image sensor according to claim 9, wherein the over-color filter is a blue color filter.

11. The image sensor according to claim 9, wherein:

the second shield region further includes peripheral color filters formed over the shield layer; and the over-color filter is formed between the peripheral color filters.

12. The image sensor according to claim 8, wherein the shield layer is formed in a flat board shape or a plate shape, and includes a lower shield layer and an upper shield layer, and wherein the lower shield layer includes an insulation material, and the upper shield layer includes a metal material.

13. The image sensor according to claim 1, wherein each microlens arranged in the first microlens array and each microlens arranged in the second microlens array are formed in compliance with the same specification.

14. An image sensor comprising:

a first microlens array including microlenses that are arranged in a first direction and a second direction perpendicular to the first direction corresponding to respective pixels; and a second microlens array surrounding the first microlens array and including microlenses arranged with the same pitch as the microlenses arranged in the first microlens array in a third direction and a fourth direction perpendicular to the third direction, the third direction is rotated by a predetermined angle relative to the first direction, wherein adjacent microlenses in the first microlens array are in contact with each other, wherein the first microlens array has a first iterative unit having a first width in the first direction, and the second microlens array has a second iterative unit having a second width different from the first width in the first direction, wherein the first iterative unit includes one microlens, and the second iterative unit includes a plurality of microlens having different heights.

15. The image sensor according to claim 14, wherein the first microlens array is disposed in an effective pixel region, wherein the effective pixel region includes:

first pixel grid patterns disposed over a substrate;

first pixel color filters formed in spaces between the first pixel grid patterns; and a first pixel over-coating layer disposed between the first microlens array and the first pixel color filters.

16. The image sensor according to claim 15, wherein the second microlens array is disposed in a shield region, wherein the shield region includes:

a shield layer disposed over the substrate; and a peripheral over-coating layer disposed between the shield layer and the second microlens array.

17. An image sensor comprising:

a first microlens array including microlenses that are arranged in a first direction and a second direction perpendicular to the first direction corresponding to respective pixels; and a second microlens array surrounding the first microlens array and including microlenses arranged with the same pitch as the microlenses arranged in the first microlens array in a third direction and a fourth direction perpendicular to the third direction, the third direction is rotated by a predetermined angle relative to the first direction, wherein the microlenses of the second microlens array overlaps a shield layer including a metal material and disposed between the microlenses of the second microlens array and photodiodes formed in a substrate, and wherein the predetermined angle is determined based on, among chief rays incident on the second microlens array, an angle of incidence of a light ray component associated with flare phenomenon.

18. The image sensor according to claim 17, wherein the first microlens array is disposed in an effective pixel region, wherein the effective pixel region includes:

first pixel grid patterns disposed over a substrate;

first pixel color filters formed in spaces between the first pixel grid patterns; and a first pixel over-coating layer disposed between the first microlens array and the first pixel color filters.

19. The image sensor according to claim 18, wherein the second microlens array is disposed in a shield region that includes the shield layer, and a peripheral over-coating layer disposed between the shield layer and the second microlens array.

* * * * *